United States Patent [19]
Nakakuma et al.

[11] Patent Number: 5,515,312
[45] Date of Patent: May 7, 1996

[54] SEMICONDUCTOR MEMORY DEVICE

[75] Inventors: Tetsuji Nakakuma, Takatsuki; Tatsumi Sumi, Mishima; Hiroshige Hirano; George Nakane, both of Nara; Nobuyuki Moriwaki, Kyoto; Toshio Mukunoki, Takatsuki, all of Japan

[73] Assignee: Matsushita Electric Industrial Co., Ltd., Osaka, Japan

[21] Appl. No.: 322,541

[22] Filed: Oct. 13, 1994

[30] Foreign Application Priority Data

Feb. 15, 1994 [JP] Japan ..................... 6-018268

[51] Int. Cl.$^6$ ................................. G11C 11/22
[52] U.S. Cl. ............... 365/145; 365/201; 365/189.01
[58] Field of Search ..................... 365/117, 145, 365/201, 189.01

[56] References Cited

U.S. PATENT DOCUMENTS

| | | | |
|---|---|---|---|
| 4,873,664 | 10/1989 | Eaton, Jr. | 365/145 |
| 5,345,414 | 9/1994 | Nakamura | 365/145 |
| 5,381,379 | 1/1995 | Fukumoto | 365/145 X |

*Primary Examiner*—Joseph A. Popek
*Attorney, Agent, or Firm*—Willian Brinks Hofer Gilson & Lione

[57] ABSTRACT

A semiconductor memory device comprising a pair of bit lines, a word line, a cell plate electrode, a memory cell connected to each of the bit lines, the word line and the cell plate electrode, and a prevention means that permits only a predetermined number of readouts of data stored in the memory cell, after which the data is destroyed and is not retrieved with subsequent readout attempts.

28 Claims, 19 Drawing Sheets

SEMICONDUCTOR MEMORY DEVICE

BACKGROUND OF THE INVENTION

Dynamic Random Access Memory chips (DRAMs) are widely used among semiconductor memory devices because of their high density and low cost. The basic operation of a DRAM is to record data by storing bits as the presence ("1") or absence ("0") of electrical charge in memory cell capacitors. Silicon oxide is traditionally used as the dielectric layer of the memory cell capacitor of the DRAM, but recently DRAMS have been developed using a ferroelectric layer instead.

A circuit diagram of a semiconductor memory device using ferroelectric capacitors as taught by prior art is represented in FIG. 27. FIG. 27 depicts a semiconductor memory device having four memory cells 30a, 30b, 30c, 30d arranged in two rows and two columns, although a different number of memory cells could be provided. In any case, each memory cell is similarly structured, so the operation of the semiconductor memory device may be explained with respect to memory cell 30a with the understanding that corresponding operations can be applied to the other memory cells as well.

In memory cell 30a, one of a pair of ferroelectric capacitors 33a is connected through one of a pair of MOS transistors 31a to bit line 35; the other ferroelectric capacitor 33a is connected through the other MOS transistor 31a to bit line 36. The gates of both MOS transistors 31a are controlled by word line 32, and both ferroelectric capacitors 33a are connected to cell plate electrode 39. Signal line 47 supplies control signal φP to MOS transistors 43, 44, either grounding or precharging bit lines 35, 36. A second signal line 49 supplies control signal φS to sense amplifier 41.

In a memory cell such as 30a, comprised of two ferroelectric capacitors 33a and two MOS transistors 31a, data is written by applying logical voltages of opposite polarities to the pair of ferroelectric capacitors 33a. The stored data can then be read by reading out the residual charges from the pair of ferroelectric capacitors 33a onto the pair of bit lines 35, 36, and amplifying the potential difference between the bit lines 35, 36 with the sense amplifier 41.

The operation of the prior art semiconductor memory device of FIG. 27 can be explained in greater detail with reference to FIGS. 28 and 29. FIG. 28 shows a hysteresis curve; FIG. 29 is a timing chart of a readout operation on memory cell 30a.

As shown in FIG. 28, initially, word line 32, cell plate electrode 39, bit lines 35, 36 and signal line 49 supplying control signal φS are all at a low logical voltage "L". While signal line 47 supplying control signal φP is at a high logical voltage "H". To enable the memory device to read the data stored in ferroelectric capacitors 33a, signal line 47 is changed to "L", shifting bit lines 35, 36 to a floating state. Word line 32 and cell plate electrode 39 are then changed to "H", turning on MOS transistors 31a and enabling the data stored in ferroelectric capacitors 33a to be read out onto bit lines 35, 36.

The potential difference between the charges read out from ferroelectric capacitors 33a onto bit lines 35, 36 is shown in the hysteresis curve of FIG. 28. After data is stored in a ferroelectric capacitor and the power supply is cut off, the electric field is zero and the residual charges in the ferroelectric capacitor are utilized as nonvolatile data. The residual charge for high and low voltages are represented respectively by points B and E. When the data value stored in a memory cell is a "1", a first of the pair of ferroelectric capacitors stands at point B and the other stands at point E. When the data value stored in a memory cell is a "0", the situation is reversed, with the first ferroelectric capacitor at point E and the other at point B.

Still referring to FIG. 28, the slopes of straight lines L1, L2 depend on the parasitic capacitance of bit lines 35, 36: the less parasitic the capacitance, the smaller the absolute value of the slope. Points M21 and N21 are found by horizontally shifting points B and E by a magnitude of electric field produced when the voltages of word line 32 and cell plate electrode 39 are at a logical voltage "H".

The curves from the points B and E to point D represent the electrical charge held in ferroelectric capacitors 33a as the electrical field changes due to the voltage shift of word line 32 and cell plate electrode 39 from "L" to "H". When a stored data value "1" is read out onto bit line 35 from a first of the pair of ferroelectric capacitors 33a, the state of that ferroelectric capacitor 33a moves from point B to point O21, where the hysteresis curve intersects with line L1. Similarly, the state of the second ferroelectric capacitor 33a, which carries an opposite logical value from the first ferroelectric capacitor 33a, moves from point E to point P21, where the hysteresis curve intersects with line L2. Thus the read-out potential difference between the pair of bit lines 35, 36 becomes Vr21, the difference between the electric fields at point O21 and point P21.

To read the data on bit lines 35, 36, the potential difference Vr21 is amplified and signal line 49 supplying control signal φS is shifted from "L" to "H". When the amplification in the sense amplifier 41 is complete, the state of bit line 35 shifts from point O21 to point Q21, and the state of bit line 36 shifts from point P21 to point D.

When the data is read, the charges in ferroelectric capacitors 33a dissipate and must be rewritten. Voltage at cell plate electrode 39 shifts from "L" to "H", moving bit line 35 from point Q21 to point A. Similarly, bit line 36 moves from point D to point E. This completes the rewriting process, and the semiconductor memory device is now restored to its initial state: word line 32 and control signal φS are shifted to "L", signal line 47 is shifted to "H", and bit lines 35, 36 are returned to "L" from floating state.

If the value stored in memory cell 30a is "0" rather than "1", with the effect that the first of the pair of ferroelectric capacitors 33a stores a "0" and the other ferroelectric capacitor 33a stores a "1", the states of the bit lines 35, 36 are reversed, but the process remains the same and the potential difference remains Vr21.

The prior art semiconductor memory device described above is able to write data into its memory, as well as read and rewrite stored data from memory. However, having no means to monitor the number of readouts performed, it is impossible to limit data readout operations to a number agreed upon between the data offerer and the data user.

Moreover, a semiconductor memory device as taught by the prior art has no security feature to prevent an outsider from reading normal data stored in it. Thus, if a user fails to erase information stored as normal data in the device after completing use of that information, an outsider who obtains the device can read out that information as normal data.

Accordingly, there exists a need for a semiconductor memory device with the enhanced capability to limit the number of data readouts to a predetermined maximum limit, as well as to provide a security feature to automatically change information stored as normal data to abnormal data after the information is no longer needed by the user, in order to prevent outsiders from being able to read out information stored on the device as normal data.

SUMMARY OF THE INVENTION

The present invention provides such a semiconductor memory device capable of limiting the number of normal data readouts.

Accordingly, the present invention relates to a semiconductor memory device comprising a pair of bit lines, a word line, a cell plate electrode, a memory cell for storing data, connected to the pair of bit lines, the word line and the cell plate electrode, and prevention means for preventing normal readout of the stored data, after the number of readouts executed on the stored data reaches a predetermined limiting number of readouts permitted.

The present invention also relates to a method of limiting the number of normal readouts of data stored in a semiconductor memory device by determining whether the number of readouts already executed on the stored data has reached the predetermined limiting number of readouts permitted, and accordingly, preventing subsequent readouts if the predetermined limiting number has been reached.

As described in detail below, the semiconductor memory device of the present invention may limit the number of data readout operations in a variety of ways. Illustrative means include causing erratic readout of the data, destroying stored data, inhibiting the writing of normal data, and inhibiting the rewriting of read out data.

The invention itself, together with further objects and attendant advantages, will be understood by reference to the following detailed description, taken in conjunction with the accompanying drawings.

DETAILED DESCRIPTION OF THE DRAWINGS

Figure 1:
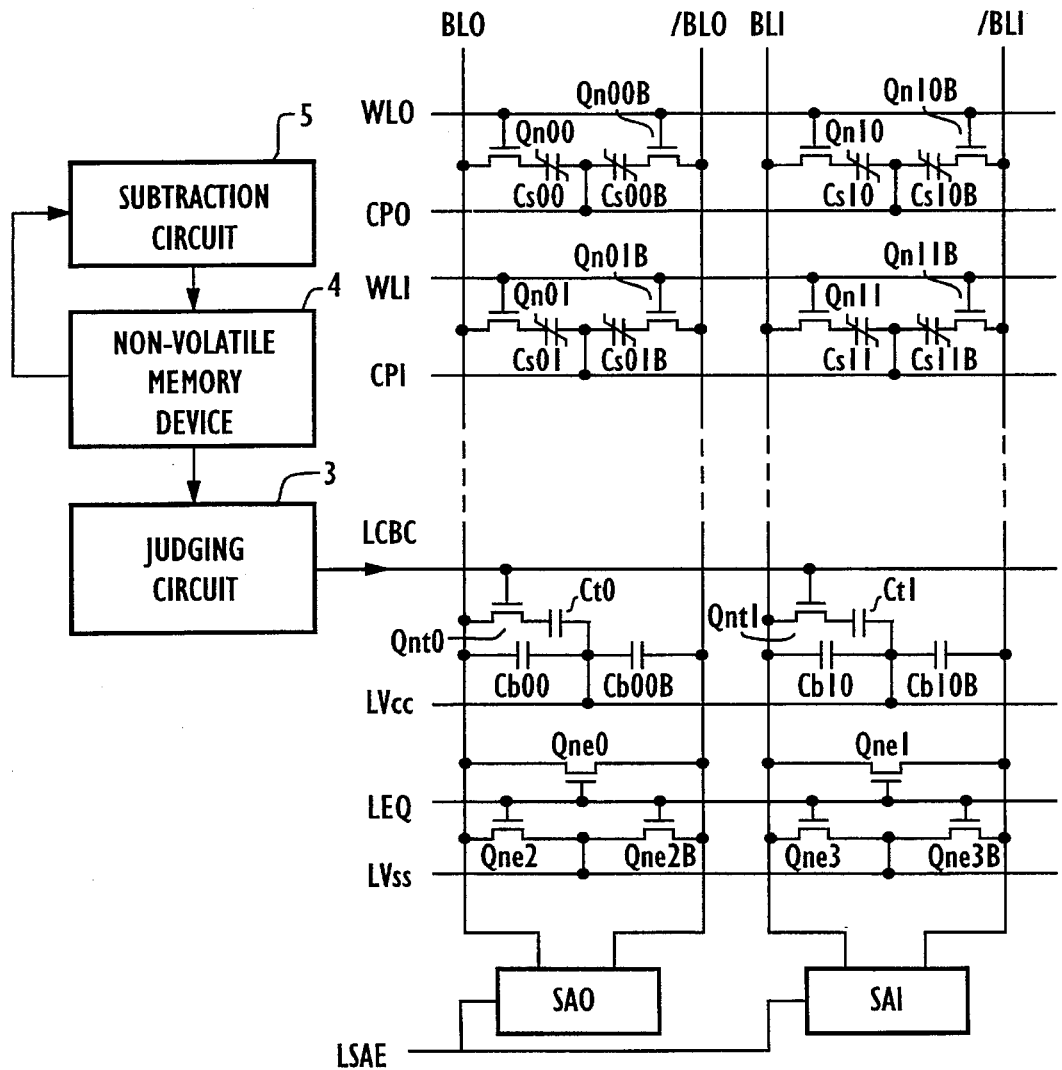
FIG. 1 shows a schematic circuit diagram of the present invention in a first embodiment.

Turning now to the drawings, the schematic circuit diagram of FIG. 1 illustrates the components of the present invention in a first embodiment. As shown, a semiconductor memory device as taught by this invention is comprised of MOS transistors Qn00, Qn00B, Qn01, Qn01B, Qn10, Qn10B, Qn11, QN11B, ferroelectric capacitors Cs00, Cs00B, Cs01, Cs01B, Cs10, Cs10B, Cs11, Cs11B, word lines WL0, WL1, bit lines BL0, /BL0, BL1, /BL1, cell plate electrodes CP0, CP1, sense amplifiers SA0, SA1, signal lines LCBC, LVcc, LEQ, LVss, LSAE, limiting capacitors Ct0, Ct1 for limiting the number of readout operations, adjusting capacitors Cb00, Cb00B, Cb10, Cb10B for adjusting the bit line capacitance, limiting MOS transistors Qnt0, Qnt1 for limiting the number of readout operations, controlling MOS transistors Qne0, Qne1, Qne2, Qne2B, Qne3, Qne3B for controlling the signals, judging circuit 3 for comparing the data, nonvolatile memory device 4 for setting a limiting number of readouts, and subtraction circuit 5 for keeping a record of the number of readouts already performed.

Each memory cell in this first embodiment of the present invention is similarly structured, and operations explained below with respect to a particular memory cell should be understood to be applicable to corresponding elements of other memory cells as well.

One memory cell consists of a pair of MOS transistors Qn00, Qn00B and a pair of ferroelectric capacitors Cs00, Cs00B. The drain of transistor Qn00 is connected to bit line BL0, its source is connected to cell plate electrode CP0 through ferroelectric capacitor Cs00, and its gate is connected to word line WL0. The drain of MOS transistor Qn00B is connected to bit line/BL0, its source is connected to cell plate electrode CP0 through ferroelectric capacitor Cs00B, and its gate is connected to word line WL0.

The drain of limiting MOS transistor Qnt0 is connected to bit line BL0, its source is connected to signal line LVcc, which is driven by supply voltage Vcc through limiting capacitor Ct0, and its gate is connected to signal line LCBC, which supplies control signal CBC to limiting MOS transistors Qnt0, Qnt1

Limiting capacitor Ct0 is not connected to bit line BL0 until the number of readouts already executed reaches a predetermined limiting number n of readouts to be permitted. As shown in FIG. 1, limiting capacitor Ct0 and limiting MOS transistor Qnt0 are serially connected, and these are parallelly connected to adjusting capacitor Cb00. The capacitances of adjusting capacitors Cb00, Cb00B are set to be nearly equal, so when limiting MOS transistor Qnt0 is turned on, the capacitance of bit line BL0 is increased by the capacitance of limiting capacitor Ct0 and becomes larger than the capacitance of bit line BL0.

Adjusting capacitor Cb00 is connected between bit line BL0 and signal line LVcc, and adjusting capacitor Cb00B is connected between bit line/BL0 and signal line LVcc. These adjusting capacitors Cb00, Cb00B are provided in order to obtain a larger data readout potential difference that can be precisely amplified by sense amplifier SA0.

Bit lines BL0, /BL0 are equalized and precharged by applying control signal EQ. In this example, the precharge potential is assumed to be ground potential. The gates of controlling MOS transistors Qne0, Qne2, Qne2B are connected to signal line LEQ, with the drain of controlling MOS transistor Qne0 connected to bit line BL0, and its source connected to bit line /BL0. The drains of controlling MOS transistors Qne2, Qne2B are connected to bit lines BL0, /BL0 respectively, and the sources are connected to signal line LVss, which is set at ground potential Vss. Bit lines BL0, /BL0 are also connected to sense amplifier SA0.

Sense amplifier SA0 is connected to signal line LSAE, and is controlled by sense amplifier control signal SAE. A judging circuit 3 for determining the number of readouts already executed is connected to signal line LCBC. A nonvolatile memory device 4 for memorizing the limiting number of readouts is connected to judging circuit 3, and a subtraction circuit 5 for subtracting the number of readouts already executed from the limiting number of readouts is connected to nonvolatile memory device 4.

Data readout from ferroelectric capacitors Cs00, Cs00B of the semiconductor memory device described above will now be explained with reference to FIGS. 2 and 3.

A normally executed readout, occuring while the number of readouts already executed is less than the limiting number n of readouts, will be explained with reference to a particular memory cell of FIG. 1. As shown in FIG. 2, initially, bit lines BL0, /BL0 are grounded, with bit lines BL0, /BL0, word line WL0, cell plate electrode CP0, and signal line LSAE set at logical voltage "L" (low voltage), and signal line LEQ set at logical voltage "H" (high voltage). By shifting signal line LEQ to "L", controlling MOS transistors Qne0, Qne2, Qne2B are turned off and bit lines BL0, /BL0 are set in a floating state. Word line WL0 and cell plate electrode CP0 are then shifted to "H" applying an electric field to ferroelectric capacitors Cs00, Cs00B and enabling data to be read out onto bit lines BL0, /BL0.

Figure 3:
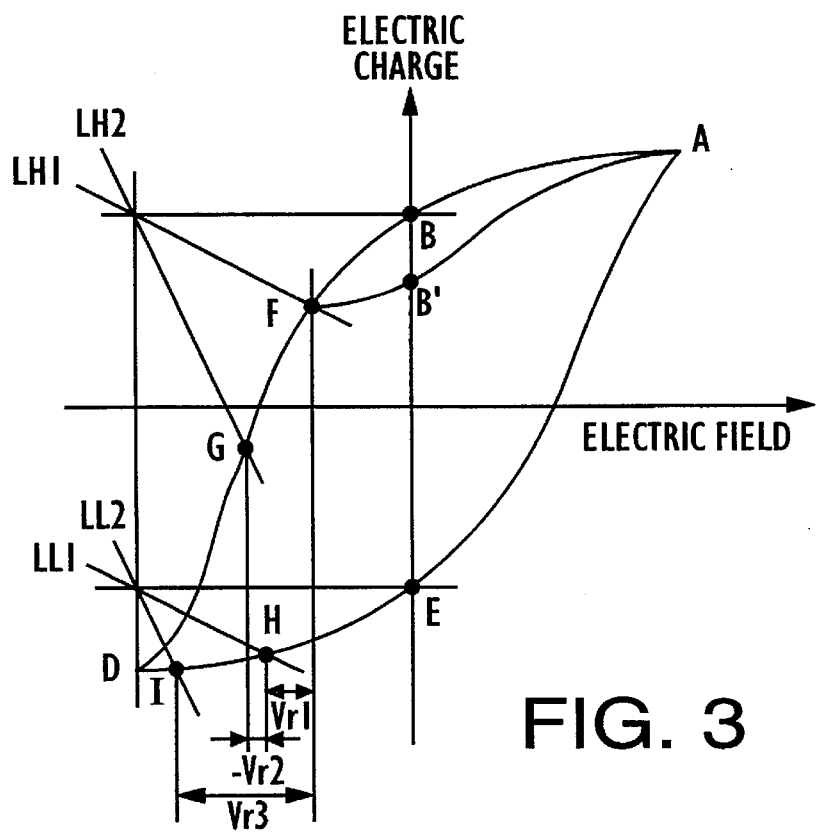
FIG. 3 is a hysteresis curve of a ferroelectric capacitor of the present invention in a first embodiment.

The readout operation may be explained in greater detail by referring to the hysteresis curve of FIG. 3. When data value stored in a memory cell is "1" the states of ferroelectric capacitors Cs00, Cs00B are respectively at points B and E, reflecting the residual polarization. Conversely, when the data value stored in memory cell is "0", the states of ferroelectric capacitors Cs00, Cs00B are reversed: Cs00 is at point E and Cs00B is at point B.

The slopes of straight lines LH1, LL1 in FIG. 3 reflect the bit line capacitance, and are further determined by shifting point B and point E horizontally, in the amount of the magnitude of the electric field produced when word line WL0 and cell plate electrode CP0 are set at "H".

When the readout data is "1", the data stored in ferroelectric capacitor Cs00 are read out onto bit line BL0, and its state shifts from point B to point F, the intersection of straight line LH1 and the hysteresis curve from point B to point D, representing the change in electrical charge when an electric field is applied to ferroelectric capacitor Cs00.

At the same time, the data stored in ferroelectric capacitor Cs00B are read out onto bit line /BL0, and its state shifts from point E to point H, the intersection of straight line LL1 and the hysteresis curve from point E to point D, representing the change in electrical charge when an electric field is applied to ferroelectric capacitor Cs00B. The potential difference read out between bit lines BL0, /BL0 is Vr1, which is represented in FIG. 3 as the electric field difference between point F and point H. The absolute value of the readout potential difference is Vr1 whether the stored data is "0" or "1", as the states of bit lines BL0, /BL0 are simply reversed.

When signal line LSAE is shifted to "H", sense amplifier SA0 amplifies the potential difference read onto bit lines BL0, /BL0. Consequently, the state of bit line BL0 shifts from point F to point B', and the state of bit line/BL0 shifts from point H to point D.

Cell plate electrode CP0 is then set at "L" in order to enable data rewriting. This shifts the state of bit line BL0 from point B' to point A, and the state of bit line/BL0 from point D to point E. Word line WL0 and signal line LSAE are then set at "L" and signal line LEQ is set at "H". Bit lines BL0, /BL0 are thus equalized and at a voltage level "L" returning the circuit to its initial condition.

To ensure that the potential difference Vr1 can be amplified exactly by sense amplifier SA0, the bit line capacitances, which determines the slopes of straight lines LH1, LL1, must be precisely set. Bit line capacitance is a sum of the parasitic capacitance of a bit line BL0, /BL0 and its corresponding adjusting capacitors Cb00, Cb00B. Bit lines BL0, /BL0 have nearly equal capacitance, and the total bit line capacitance can be adjusted by adjusting capacitors Cb00 and Cb00B.

The above discussion concerns only the operation of reading out stored data. Now, a method of limiting the number of readouts according to the present invention will be explained.

First, a limiting number of readouts, n, is memorized in nonvolatile memory device 4, and subtraction circuit 5 reduces n by one with each readout executed.

As long as the number of readout operations already executed does not exceed n, judging circuit 3 supplies a logical voltage "L" continuously to the gate of limiting MOS transistor Qnt0, preventing limiting capacitor Ct0 from adding to the bit line capacitance. During this stage, readouts can be executed normally and the potential difference Vr1 will remain steady, as indicated in FIG. 3.

On the (n+1)th attempted readout, where n is the limiting number of readouts, judging circuit 3 outputs a logical voltage "H", turning on limiting MOS transistor Qnt0 This connects limiting capacitor Ct0 in parallel to adjusting capacitor Cb00, adding to the bit line capacitance and rotating straight line LH1 to straight line LH2.

Thus, in reading out a data value "1", the readout potential difference is expressed by a potential difference −Vr2 between points G and H, where point G is the intersection of straight line LH2 and the hysteresis curve from point B to D. Since the potential difference −Vr2 is of an opposite polarity from the potential difference of the data normally read out, Vr1, reading and writing operations of data value "0" are performed instead, overwriting and destroying the stored data.

Similarly, the potential difference obtained by reading out a data value of "0" on the (n+1)th attempted read is expressed by Vr3, the potential difference between the point F and point I.

As described above, this first embodiment of the present invention limits the number of readouts available to a data user by essentially clearing the stored data on the (n+1)th read, and reading and rewriting all data values as "0". Thus, by the (n+2)th attempted readout, each data value "1" has been destroyed by being rewritten as "0", so all data stored in the memory cell are "0"s. Therefore, the readout potential difference will be either Vr1 or Vr3, regardless of whether the output of judging circuit 3 indicates that the limiting number of readouts has been reached.

It should be understood that the above example in which limiting capacitor Ct0 is disposed in parallel to adjusting capacitor Cb00 is just one arrangement of the first embodiment of the present invention. Alternatively, limiting capacitor Ct0 could be disposed in parallel to adjusting capacitor Cb00B instead, in which case data value "0" would be destroyed.

Another possible variation of the above example is to replace subtraction circuit 5 with a counter for counting the number of readouts.

Embodiment 2

Figure 4:
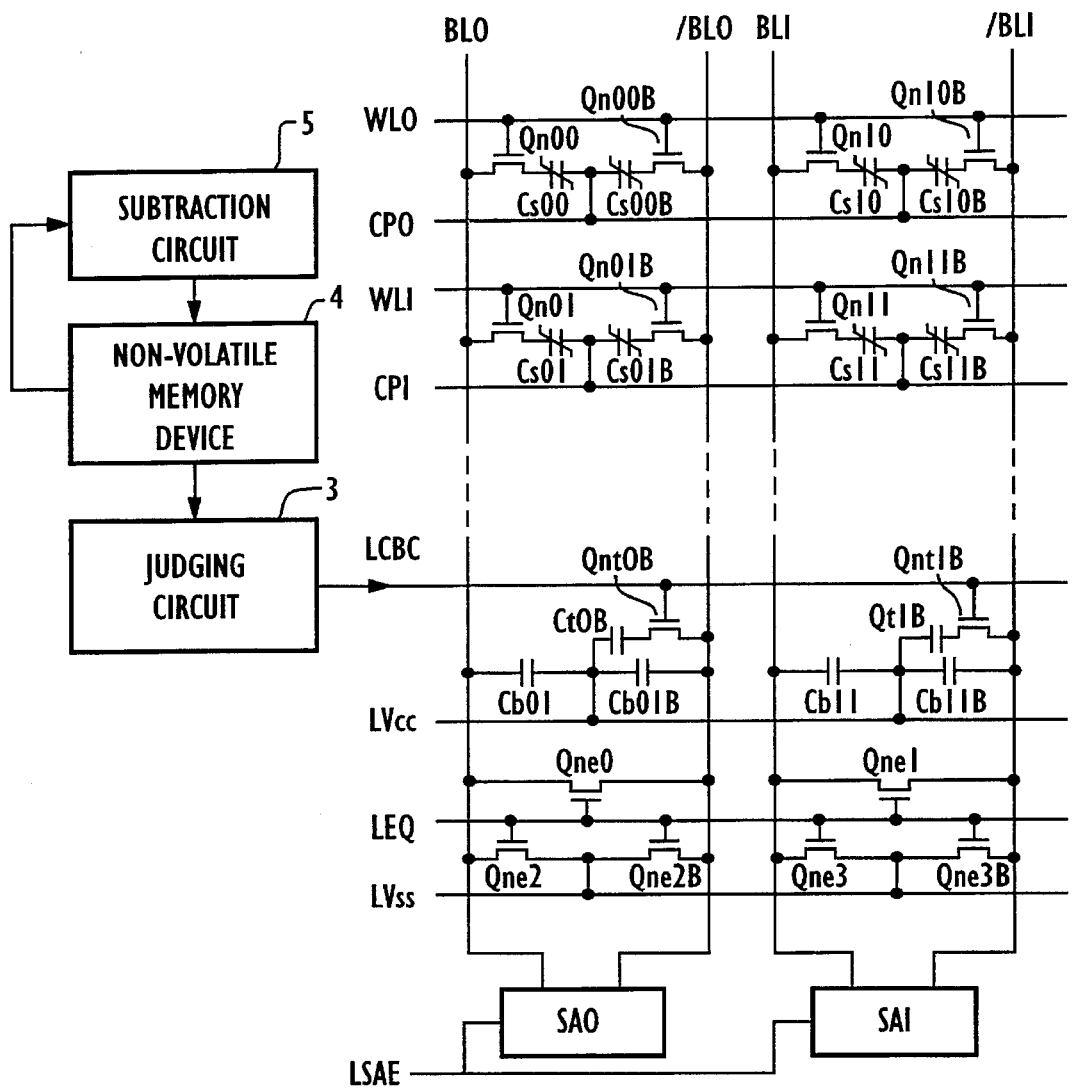
FIG. 4 shows a schematic circuit diagram of the present invention in a second embodiment.

FIG. 4 shows a second embodiment of the present invention, modifying the first embodiment shown in FIG. 1 only in that limiting MOS transistors Qnt0B, Qnt1B and limiting capacitors Ct0B, Ct1B are disposed in parallel to adjusting capacitors Cb01B, Cb11B rather than adjusting capacitors Cb01, Cb11. In order to maintain bit line capacitances of BL0 and /BL0 to be approximately equal, limiting capacitors Ct0B, Ct1B and adjusting capacitors Cb01B, Cb11B are set at a capacitance such that their sum is nearly equal to the capacitance of adjusting capacitors Cb01, Cb11.

Figure 5:
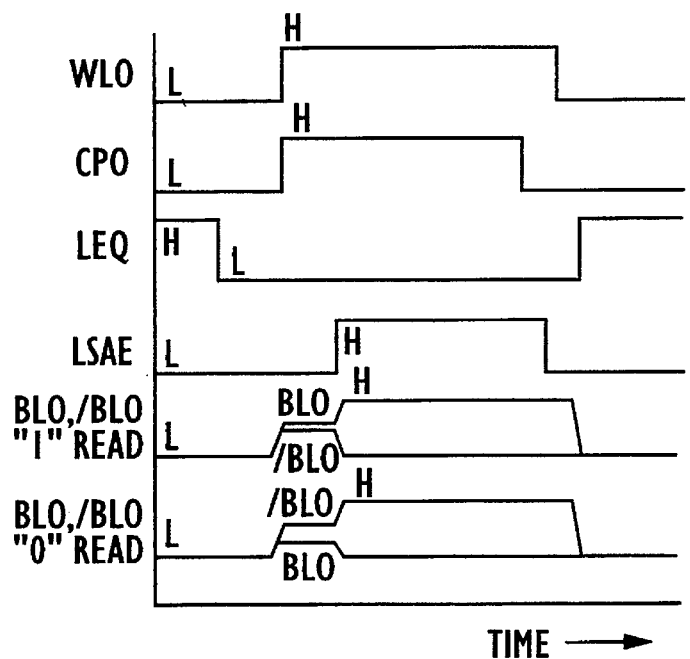
FIG. 5 shows a timing chart of a readout operation of the present invention in a second embodiment.

The readout operation of this embodiment will now be explained with reference to ferroelectric capacitors Cs00 and Cs00B. In contrast to the first embodiment of the present invention, judging circuit 3 outputs logical voltage "H" while the number of readouts already executed is less than the limiting number of readouts, n, turning on limiting MOS transistor Qnt0B. Thus, the bit line capacitances of bit lines BL0, /BL0 are approximately equal, and normal readouts are conducted as shown in the timing chart of FIG. 5 and the potential difference between point F and point H, Vr1, is read as data.

Figure 6:
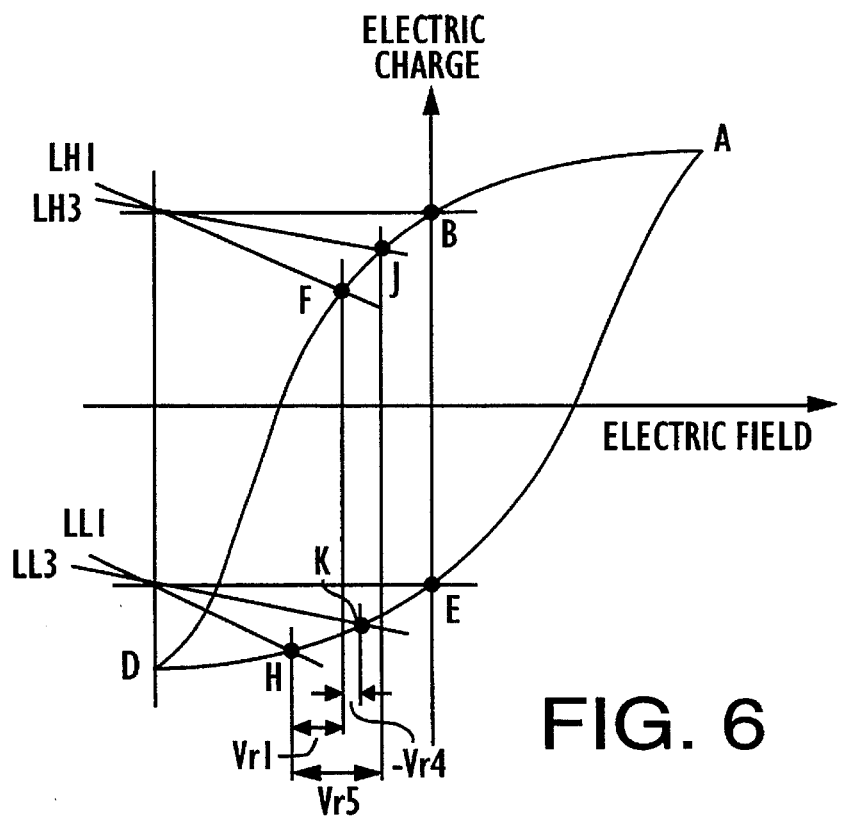
FIG. 6 is a hysteresis curve of a ferroelectric capacitor of the present invention in a second embodiment.

When the number of readouts already executed reaches the limiting number of readouts, n, judging circuit 3 outputs logical voltage "L", turning off limiting MOS transistor Qnt0B and cutting off limiting capacitor Ct0B from bit line /BL0. This decreases the bit line capacitance of bit line /BL0 and is reflected in FIG. 6 in a less steep slope of straight lines LH1 or LL1.

At this point, if attempting to read a data value "1", straight line LL1 rotates to straight line LL3 and the readout potential difference is expressed by the potential difference −Vr4 between points F and K, where point K is the intersection point between straight line LL3 and the hysteresis curve. As indicated, potential difference −Vr4 is of a polarity opposite to that of the stored data as it would have been normally read out, so although the data value stored was "1", In other words, data value "0" is both read and rewritten, resulting in the overwriting of the originally stored data.

If reading a data value "0", straight line LH1 rotates to straight line LH3 and the readout potential difference is expressed by the potential difference −Vr5 between points H and J, where point J is the intersection between straight line LH3 and the hysteresis curve. Thus, data value "0" is both read and rewritten, accurately reflecting the stored data value.

Like the first embodiment of the present invention, this second embodiment limits the number of readouts available to a data user by reading and rewriting all stored data as "0"s on the (n+1)th attempted readout. Hence, by the (n+2)th attempted readout, all stored data having value "1" will have been destroyed and all of the memory cell data will be "0"s. The readout potential difference will be either Vr1 or Vr3 regardless of whether the output from judging circuit 3 indicates that the limiting number n of readouts permitted has been reached.

As a variation of this second embodiment of the present invention, limiting capacitor Ct0B, limiting MOS transistor Qnt0B, adjusting capacitor Cb01B may be connected to bit line BL0, and adjusting capacitor Cb01 may be connected to bit line /BL0. In this case, opposite from the above example, data value "0" rather than data value "1" is destroyed.

Embodiment 3

Figure 7:
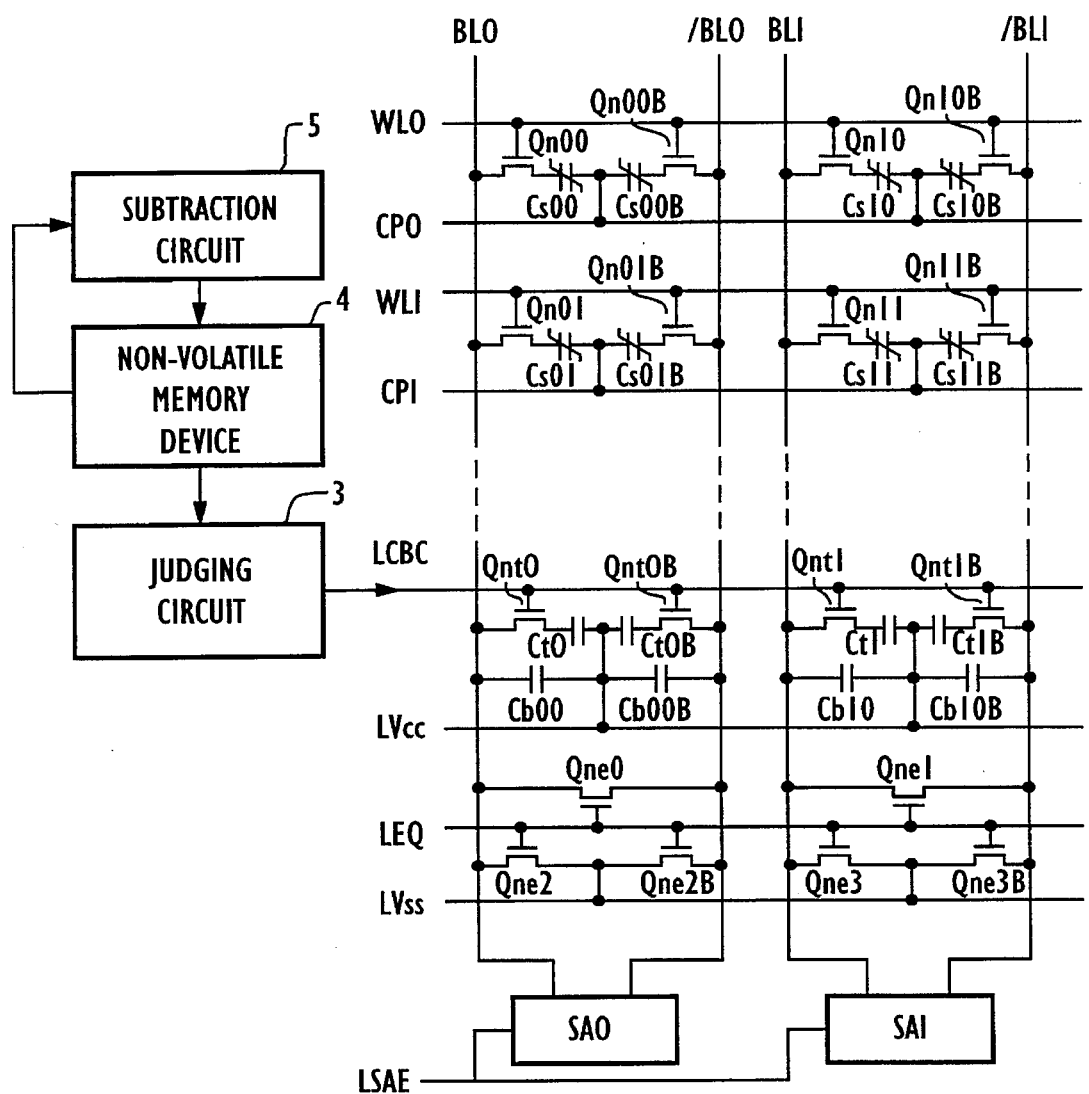
FIG. 7 shows a schematic circuit diagram of the present invention in a third and a fourth embodiment.

A schematic circuit diagram of a third embodiment of the present invention is shown in FIG. 7, another modification of the first embodiment shown in FIG. 1. The difference in the third embodiment from the first embodiment is the addition of limiting capacitors Ct0B, Ct1B are connected to bit lines /BL0, /BL1 through limiting MOS transistors Qnt0B, Qnt1B, disposed in parallel to adjusting capacitors Cb00B, Cb10B.

The capacitances of limiting capacitors Ct0B, Ct1B are set to be nearly equal to the capacitance of limiting capacitors Ct0, Ct1.

The readout operation of the semiconductor memory device of the third embodiment of the present invention is now explained with respect to ferroelectric capacitors Cs00, Cs00B.

Figure 2:
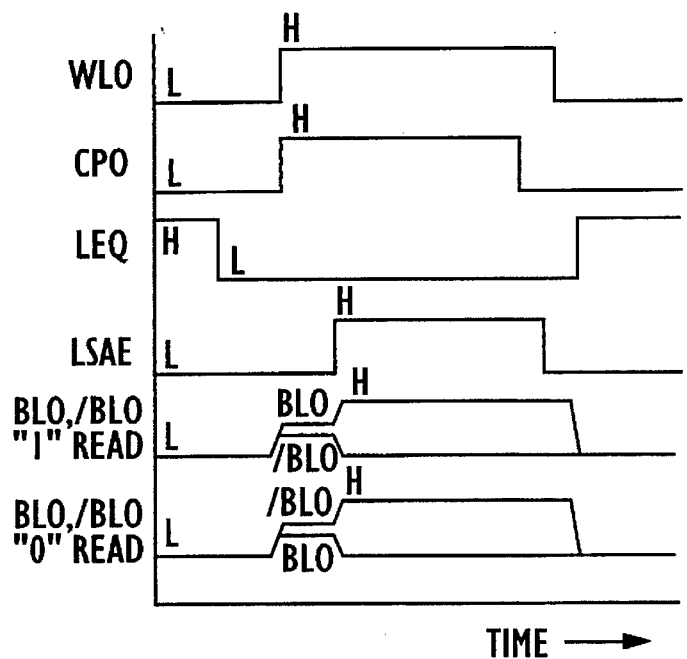
FIG. 2 shows a timing chart of a readout operation of the present invention in a first embodiment.

The readout timing of this embodiment of the present invention is identical to that of the first embodiment shown in FIG. 2. As long as the number of readouts already executed is less than the limiting number of readouts, n, judging circuit 3 outputs a logical voltage "L", turning off limiting MOS transistors Qnt0, Qnt0B.

During this normal readout period, limiting MOS transistors Ct0, Ct0B are off, so limiting capacitors Ct0, Ct0B are not connected to adjusting capacitors Cb00 and Cb00B. Thus, the potential difference Vr1, the difference between point F and point H as shown in FIG. 8, is normally read out as in the first embodiment.

When the number of readouts already executed reaches the limiting number, n, of readouts, judging circuit 3 outputs logical voltage "H", turning on limiting MOS transistors Qnt0, Qnt0B. Thus, both limiting capacitors Ct0, Ct0B are connected to adjusting capacitors Cb00, Cb00B in parallel, increasing the bit line capacitance of bit lines BL0, /BL0. Thus, straight line LH1 is rotated to straight line LH4, straight line LLI is shifted to straight line LL4, and the potential difference between points M and N, Vr6, is read out.

Figure 8:
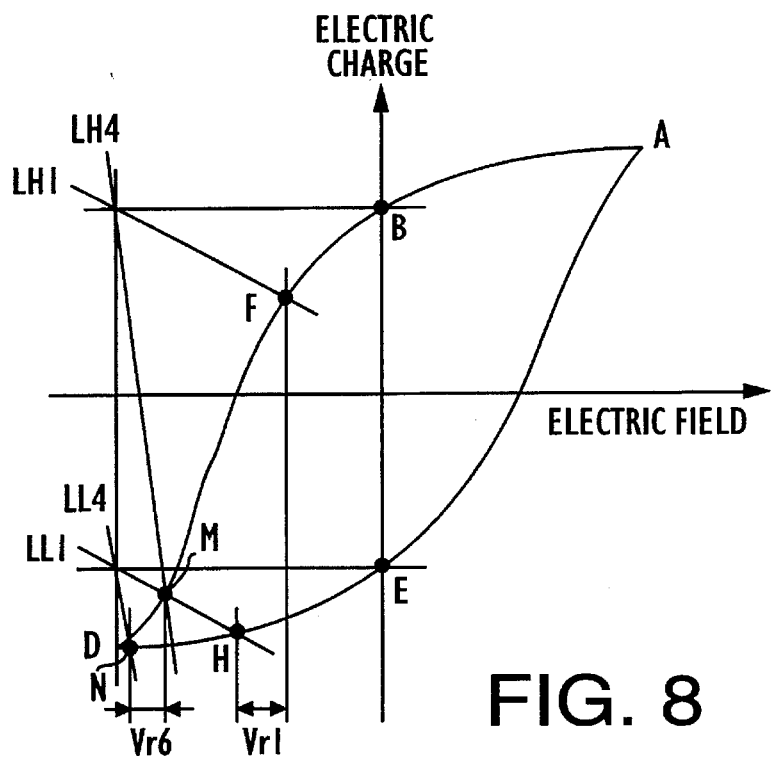
FIG. 8 shows a hysteresis curve of a ferroelectric capacitor of the present invention in a third embodiment.

As shown in FIG. 8, the magnitude of potential difference −Vr6 is so small that its normal amplification by sense amplifier SA0 is impossible. Thus, this third embodiment of the present invention prevents readouts after the nth readout by making the data impossible to read.

Embodiment 4

The basic circuit construction of the fourth embodiment of the present invention is identical to that of the third embodiment shown in FIG. 7. However, when limiting MOS transistors Qnt0, Qnt0B, Qnt1, Qnt1B are turned on, the capacitances of limiting capacitors Ct0, Ct0B, Ct1, Ct1B and adjusting capacitors Cb00, Cb00B, Cb10, Cb10B are set such that the total bit line capacitances will result in straight lines LH1, LL1 having slopes as indicated in FIG. 8.

Figure 9:
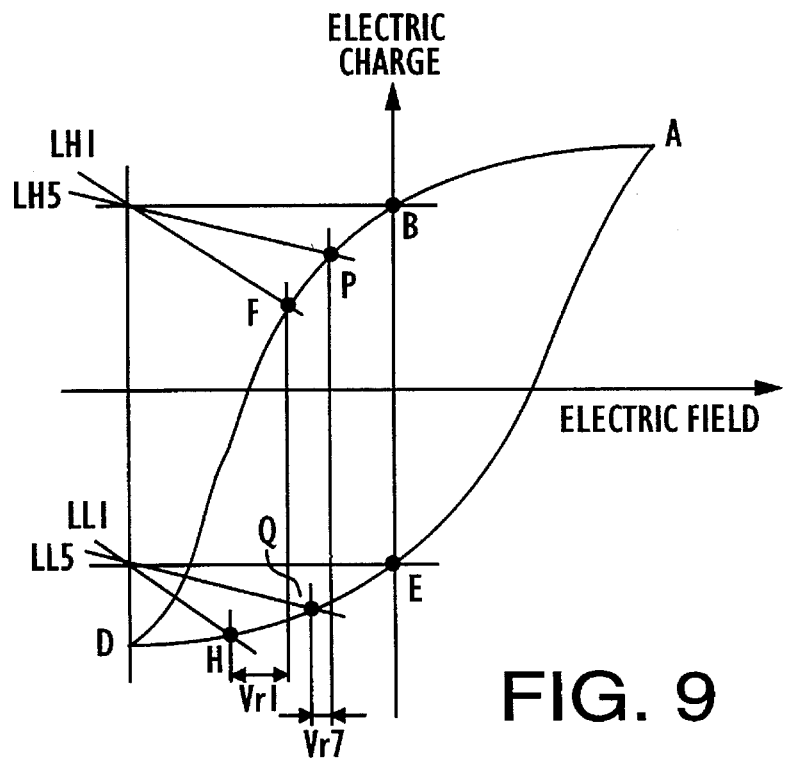
FIG. 9 shows a hysteresis curve of a ferroelectric capacitor of the present invention in a fourth embodiment.

In contrast to the third embodiment, judging circuit 3 outputs logical voltage "H" during normal readouts, turning on limiting transistors Qnt0, Qnt0B. Thus, limiting capacitors Ct0, Ct0B are normally connected to adjusting capacitors Cb00, Cb00B in parallel, and potential difference Vr1 as shown in FIG. 9 is normally read out.

When the number of readout operations already executed reaches the limiting number of readout operations, n, judging circuit 3 outputs logical voltage "L", turning off limiting MOS transistors Qnt0, Qnt0B and disconnecting limiting capacitors Ct0, Ct0B from bit lines BL0, /BL0. This decrease in bit line capacitance rotates straight line LH1 to straight line LH5, and straight line LL1 to straight line LL5, and the potential difference between point P and point Q, Vr7, is read out. As shown in FIG. 9, however, the magnitude of potential difference Vr7 is very small and cannot be normally amplified by sense amplifier SA0. Thus, as in the third embodiment of the present invention discussed above, the fourth embodiment limits the number of possible readouts by making the stored data impossible to read after the nth readout.

Embodiment 5

Figure 10:
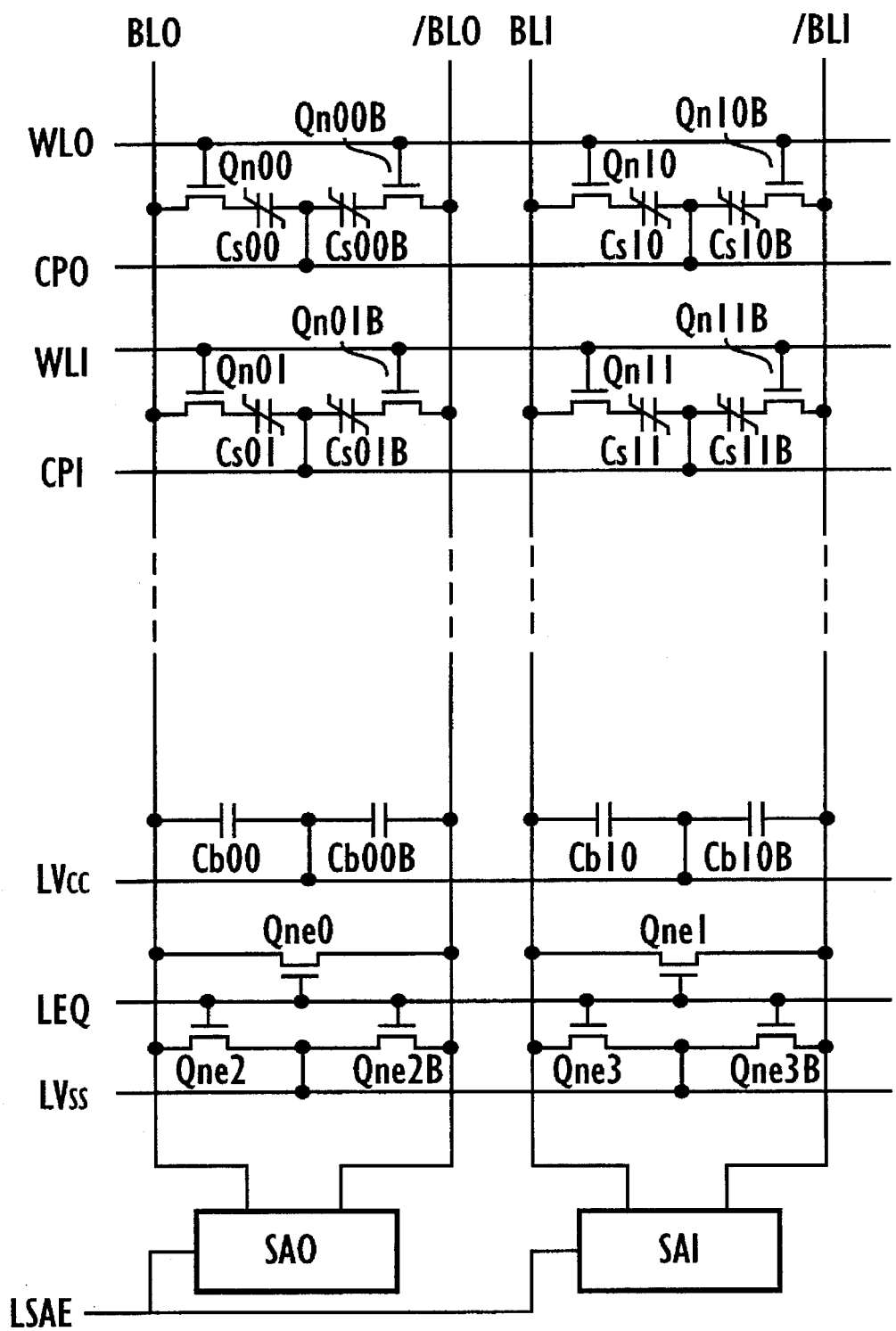
FIG. 10 shows a schematic circuit diagram of the present invention in a fifth, an eighth and a ninth embodiment.

The fifth embodiment of the present invention as shown in FIG. 10 is identical to the first embodiment shown in FIG. 1, except that limiting capacitors Ct0, Ct1, limiting MOS transistors Qnt0, Qnt1, signal line LCBC, judging circuit 3, nonvolatile memory device 4, and subtraction circuit 5 are all eliminated from the circuit.

In other words, the circuit construction of this embodiment is identical to that of the first embodiment with limiting MOS transistors Qnt0, Qnt1 permanently turned off. Thus, the operation timing is identical with the operation timing of the first embodiment of the present invention shown in FIG. 2.

Figure 11:
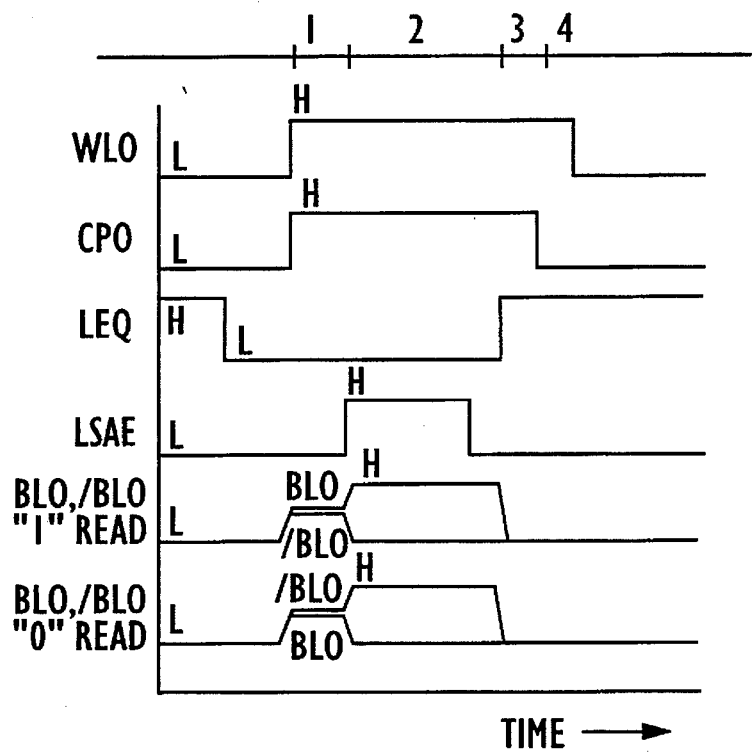
FIG. 11 shows a timing chart of a readout operation of the present invention in a fifth embodiment.

The present invention permits normal readout only while the number of readouts already executed is less than the limiting number n of readouts permitted. FIG. 11 is a timing chart showing the last permitted readout (identical to the operation shown in FIG. 2) along with the data rewriting operation conducted within the semiconductor memory device of the present invention.

A normal readout operation as shown in FIG. 2 concludes with a rewriting of the data conducted by shifting the logical voltages of word line WL0 and cell plate electrode CP0 from "H" to "L" before shifting signal line LEQ from "L" to "H".

However, when a rewriting operation according to FIG. 11 is attempted after the nth normal data readout operation, signal line LSAE is changed from "H" to "L" and signal line LEQ is changed from "L" to "H", prior to word line WL0 and cell plate electrode CP0 being shifted from "H" to "L". This order equalizes the bit lines BL0, /BL0 at voltage level "L", setting the data values held to "0" rather than enabling an accurate rewrite.

These differences between the timing of the reversing of logical voltage during normal rewriting operations and rewriting operations attempted after the nth normal readout operation are performed by using a signal reversing circuit (not shown in FIG. 10).

Figure 12:
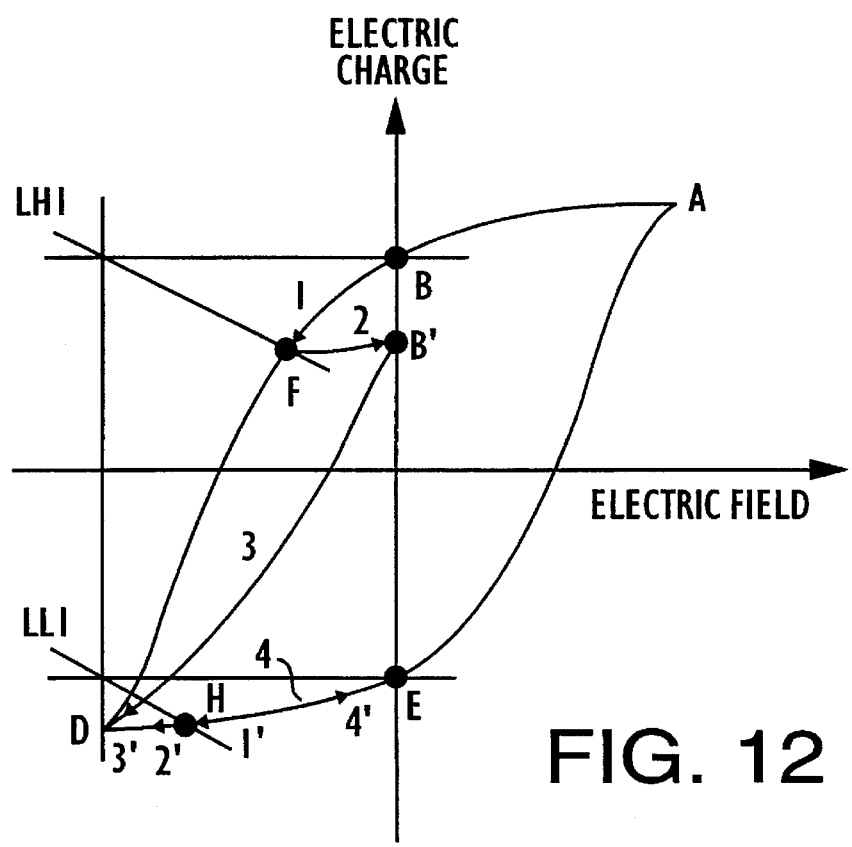
FIG. 12 shows a hysteresis curve of a ferroelectric capacitor of the present invention in a fifth embodiment.

By these signal changes, the state on the hysteresis curve of a memory cell storing data value "1" is sequentially shifted from point B to point E taking a path of 1–2–3–4(B–F– B'–D–H–E), as shown in FIG. 12. If the memory cell is storing a data value "0", its state is sequentially shifted from point E back to point E, taking a path of 1'–2'–3'–4'(E–D–H–E).

In other words, by altering the timing of the readout and rewrite operations, data in the memory cells are all erased by equalizing the ferroelectric capacitors Cs00, Cs00B to a "0" state. Thus, accurate data readout becomes impossible after the nth readout.

As always, variations of the above embodiment of the present invention are available. For example, one possible variation could be to change the operation timing by means of a control circuit consisting of judging circuit 3, nonvolatile memory device 4, and subtraction circuit 5 as shown in FIG. 1.

Embodiment 6

Figure 13:
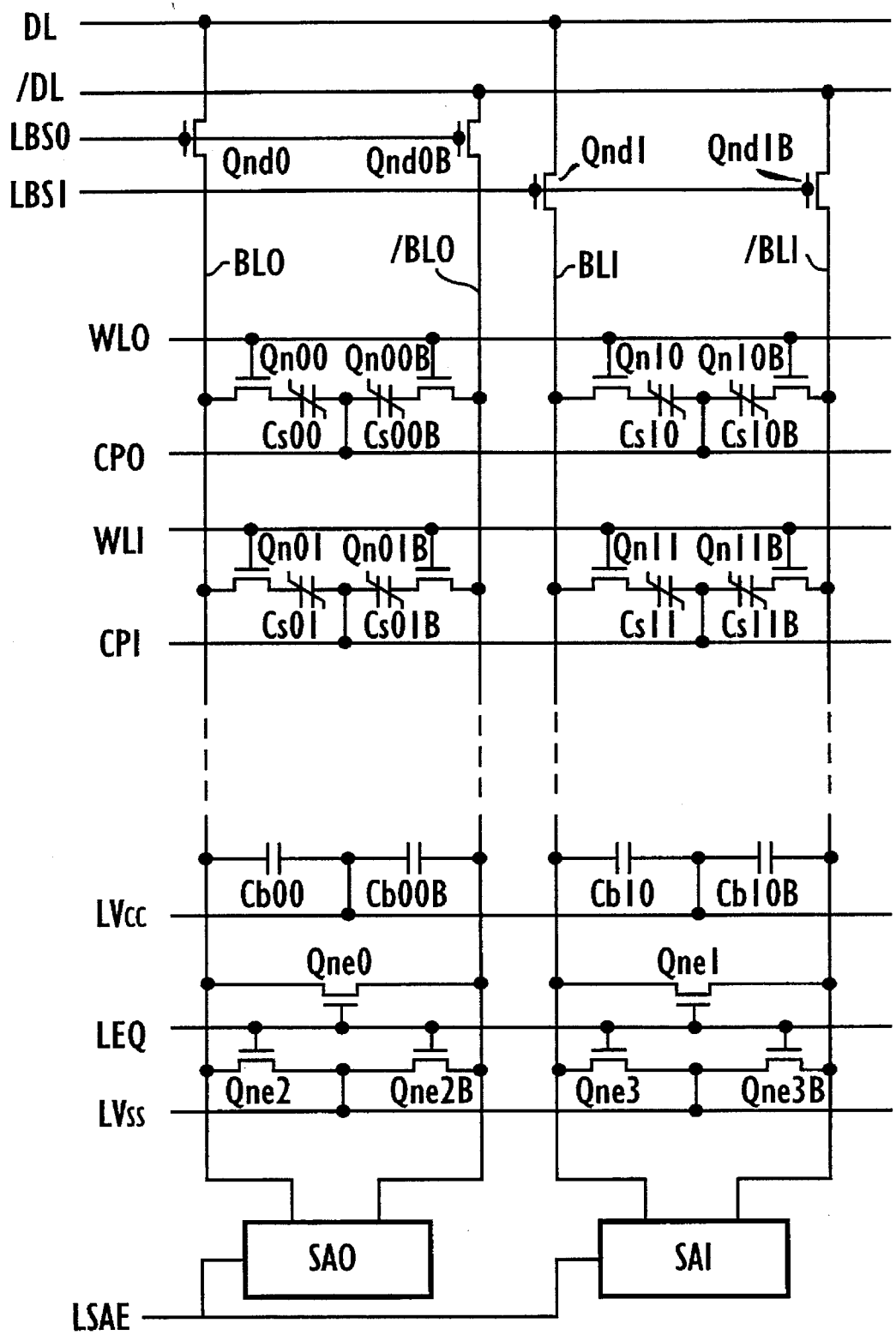
FIG. 13 shows a schematic circuit diagram of the present invention in a sixth embodiment.

The sixth embodiment of the present invention, shown in FIG. 13, is a modification of the fifth embodiment, shown in FIG. 10, with the differences being the additions of data lines DL, /DL and signal lines LBS0, LBS1 for supplying bit line selection signals BS0, BS1.

Data lines DL, /DL are respectively connected to bit lines BL0, BL1, /BL0, /BL1 through MOS transistors Qnd0, Qnd1, Qnd0B, Qnd1B. Gates of MOS transistors Qnd0, Qnd0B are connected to signal line LBS0, and gates of transistors Qnd1, Qnd1B are connected to signal line LBS1.

The normal data readout operation in the sixth embodiment is identical to that in the fifth embodiment as indicated in FIG. 2. However, as shown in FIG. 14, the rewriting operation after the nth readout operation differs.

Figure 14:
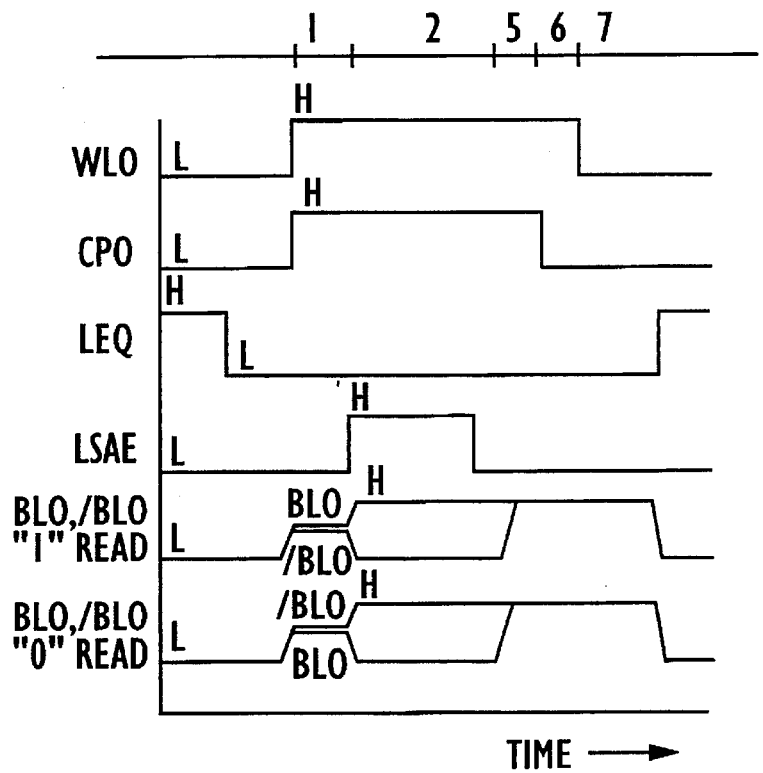
FIG. 14 shows a timing chart of a readout operation of the present invention in a sixth embodiment.

As shown in FIG. 14, after completing the readout operations, the logical voltage of signal line LSAE is changed from "H" to "L" and "H" is written into ferroelectric capacitors Cs00, Cs00B, Cs10, Cs10B through data lines DL, /DL, since MOS transistors Qnd0, Qnd0B, Qnd1, Qnd1B are turned on. After this has been completed, cell plate electrode CP0 and word line WL0 are changed from "H" to "L".

Figure 15:
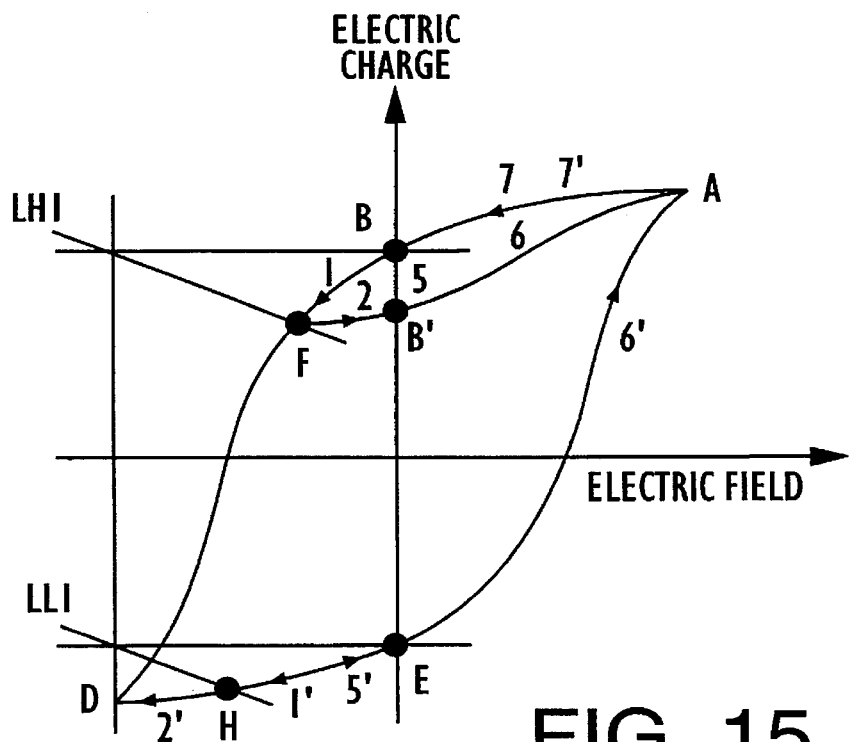
FIG. 15 shows a hysteresis curve of a ferroelectric capacitor of the present invention in a sixth embodiment.

If a data value "1" is stored in a ferroelectric capacitor, the state is sequentially shifted from point B back to point B over the path of 1–2–5–6–7(B–F–B'–A–B), as shown in FIG. 15. On the other hand, if data value "0" is stored, the state is sequentially shifted from point E to point B over the path of 1'–2'–5'–6'–7' (E–H–D–H–E–A–B). Thus, data value "1" is written in all ferroelectric capacitors, overwriting the actual data in the memory cells such that the data cannot be accurately read out after the nth readout operation.

A possible variation of the data destruction method described above is to write an "L" rather than an "H" into each ferroelectric capacitor. The timing chart of this operation is shown in FIG. 16 and the hysteresis curve is shown in FIG. 17.

Figure 16:
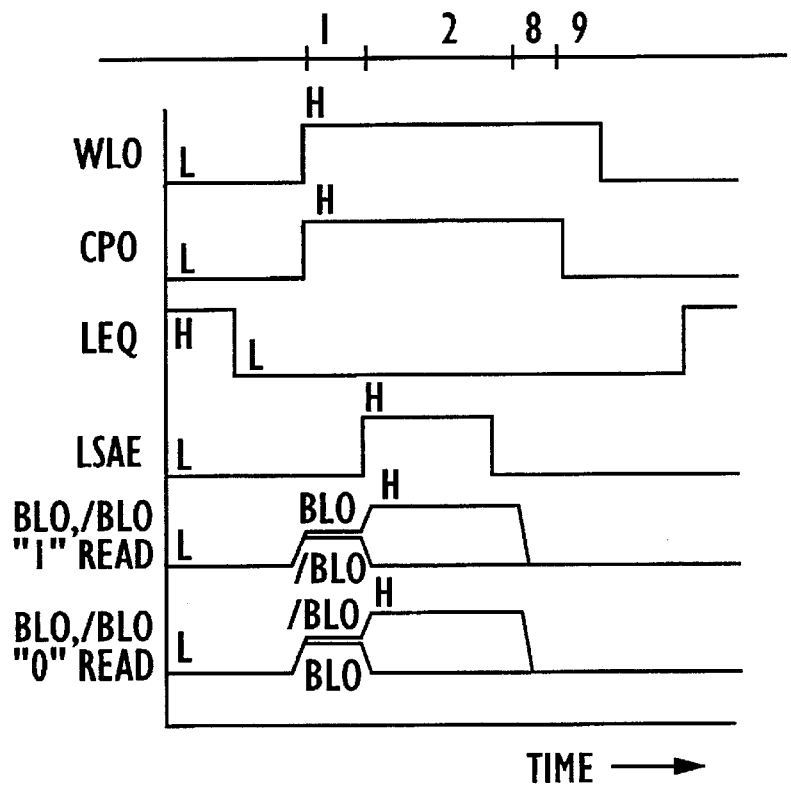
FIG. 16 shows a timing chart of a variation of a readout operation of the present invention in the sixth embodiment.

As shown in FIG. 16, after finishing the data readout operation, the logical state of signal line LSAE is changed from "H" to "L", and after "L" is written in each ferroelectric capacitor through data lines DL, /DL, cell plate electrode CP0 and word line WL0 are changed from "H" to "L".

Figure 17:
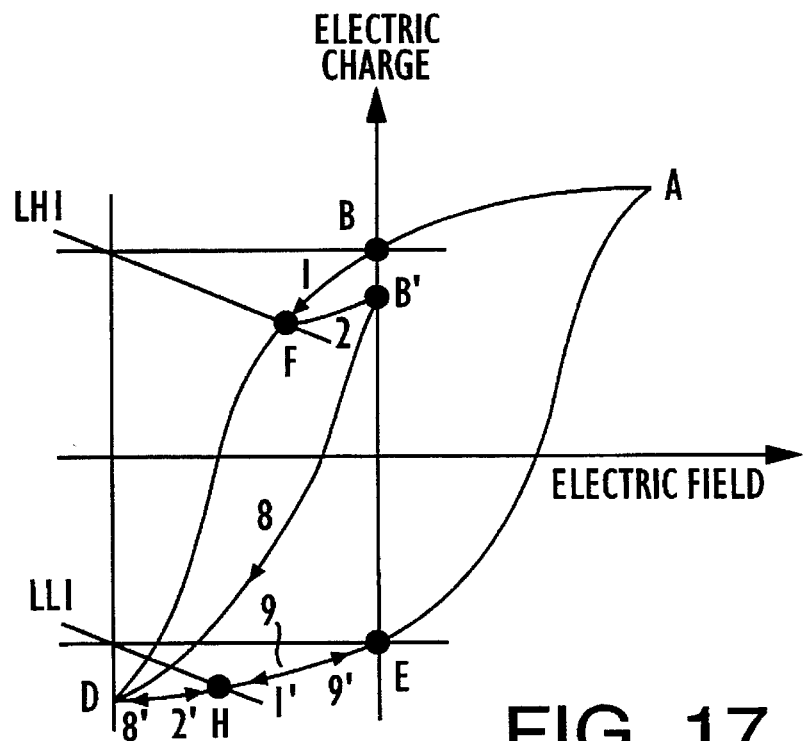
FIG. 17 shows a hysteresis characteristics of the ferroelectric capacitor of the present invention in a variation of the sixth embodiment.

If a data value "1" is stored in a memory cell, the state is sequentially shifted from point B to point E over the path of 1–2–8–9– (B–F–B'–D–E) as shown in FIG. 17. If a data value "0" is stored, the state is sequentially shifted from point E back to point E over a path of 1"2'–8'–9' (E–H–D–H–E). Thus, data value "0" is written in each ferroelectric capacitor, overwriting the actual data stored.

Embodiment 7

Figure 18:
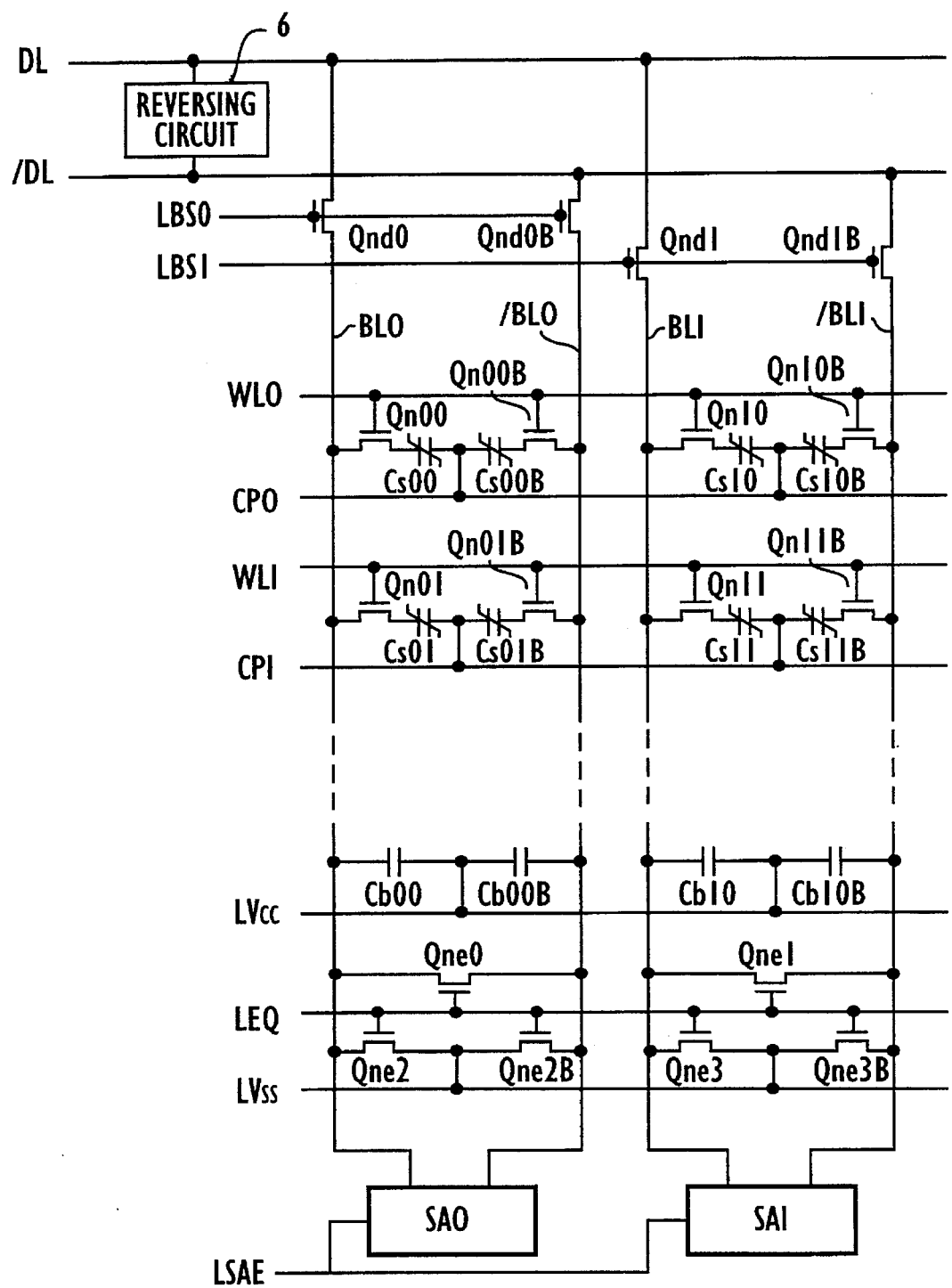
FIG. 18 shows a schematic circuit diagram of the present invention in a seventh embodiment.

The seventh embodiment of the present invention shown in FIG. 18 is a modification of the sixth embodiment shown in FIG. 13, with the difference being the addition of reversing circuit 6 between data lines DL, /DL.

Figure 19:
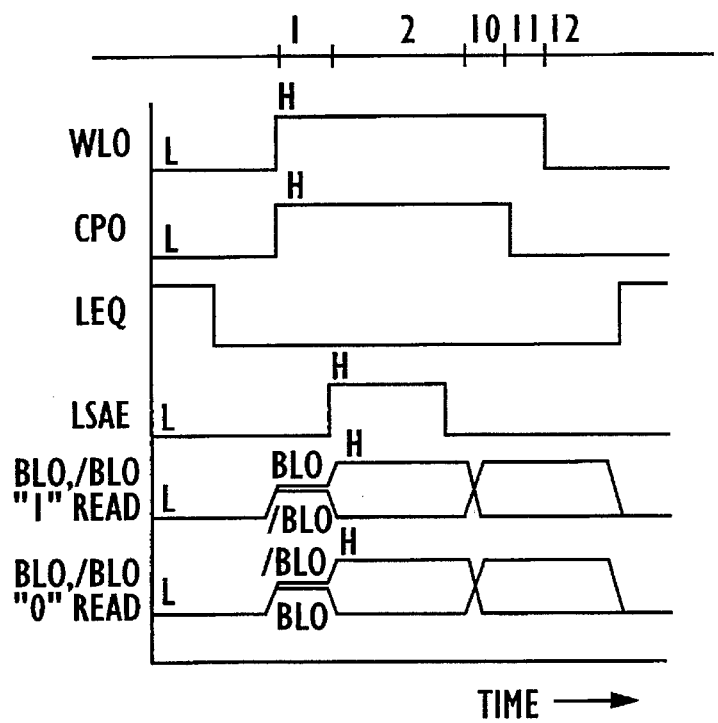
FIG. 19 shows a timing chart of the readout operation of the present invention in a seventh embodiment.

The normal data readout operation in this embodiment is identical to that in the sixth embodiment and is represented in FIG. 2. However, the rewriting operation after the nth readout operation differs. FIG. 19 is a timing chart of the nth readout operation and the subsequent data rewriting operation.

As shown in FIG. 19, after completing the readout operation, the logical voltage of signal line LSAE is shifted from "H" to "L". Then, the reversing circuit 6 reverses the logical voltages on data lines DL, /DL, rewriting the reversed data into the memory cells. After the reversal and rewriting are completed, the logical voltage of cell plate electrode CP0 and word line WL0 shift from "H" to "L".

Figure 20:
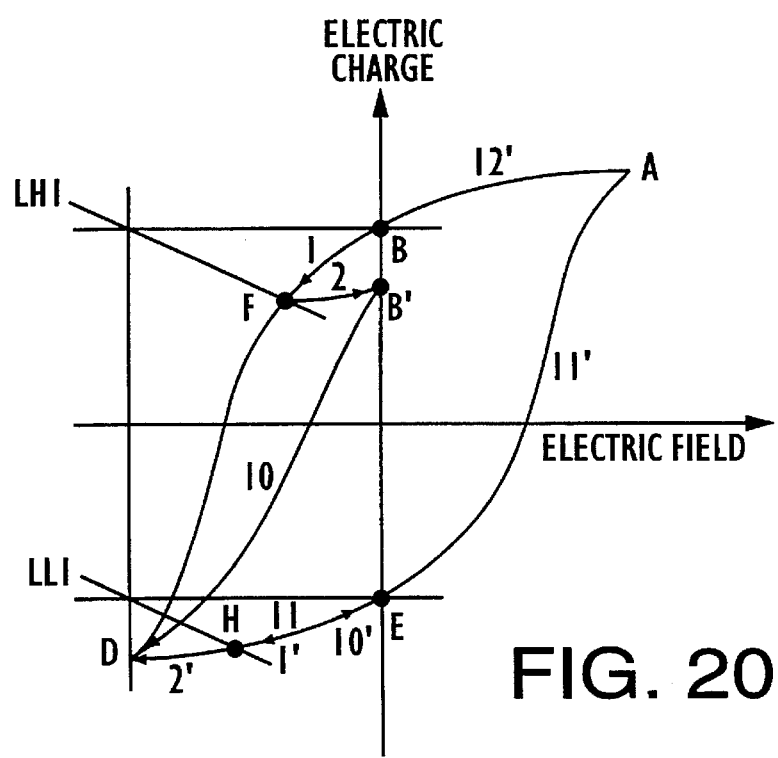
FIG. 20 shows a hysteresis curve of a ferroelectric capacitor of the present invention in a seventh embodiment.

If a data value "1" is stored in the ferroelectric capacitor, the state is sequentially shifted from point B to point E over the path of 1–2–10–11–12(B–F–B'–D– E), as shown in FIG. 20. If the data value stored is a "038 the state is sequentially shifted from point E to point B over the path of 1'–2'–10'–11'–12'–(E–H–D–H–E–A–B).

This operation by the reversing circuit 6 destroys all the data stored in the memory cells by reversing all data values of "0" or "1" stored, making subsequent accurate readout operations impossible.

Embodiment 8

Figure 22:
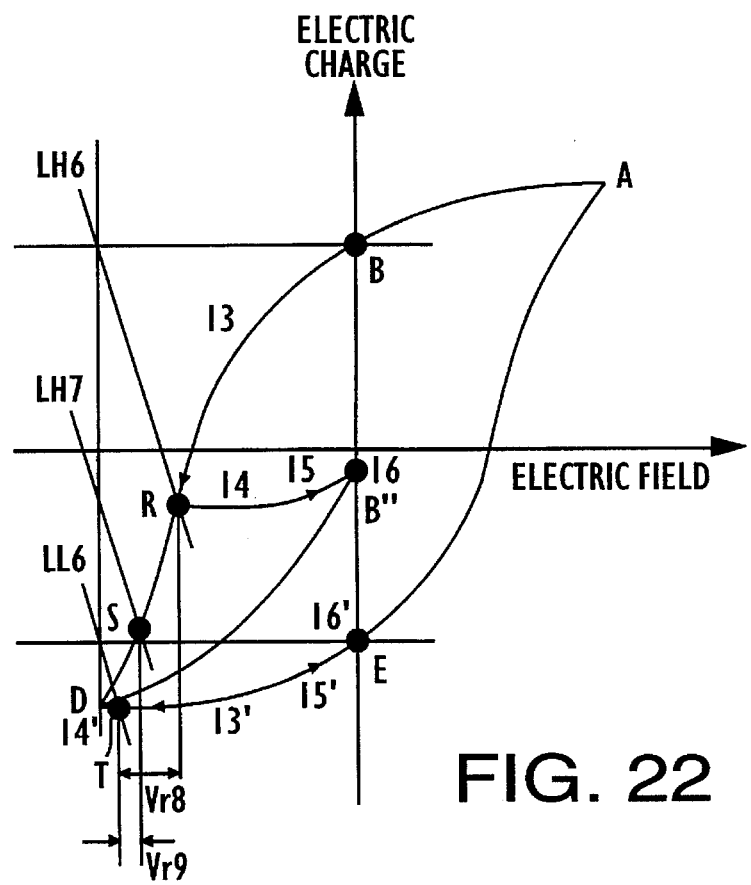
FIG. 22 shows a hysteresis curve of a ferroelectric capacitor of the present invention in an eighth embodiment.

The eighth embodiment of the invention is another variation of the fifth embodiment shown in FIG. 10, with the difference that the capacitances of adjusting capacitors Cb00, Cb00B of the eighth embodiment are larger than those in the fifth embodiment. Thus, the slopes of straight lines LH6 and LL6, shown in FIG. 22, are steeper than those of the straight lines LH1 and LL1 shown in FIG. 12.

Figure 21:
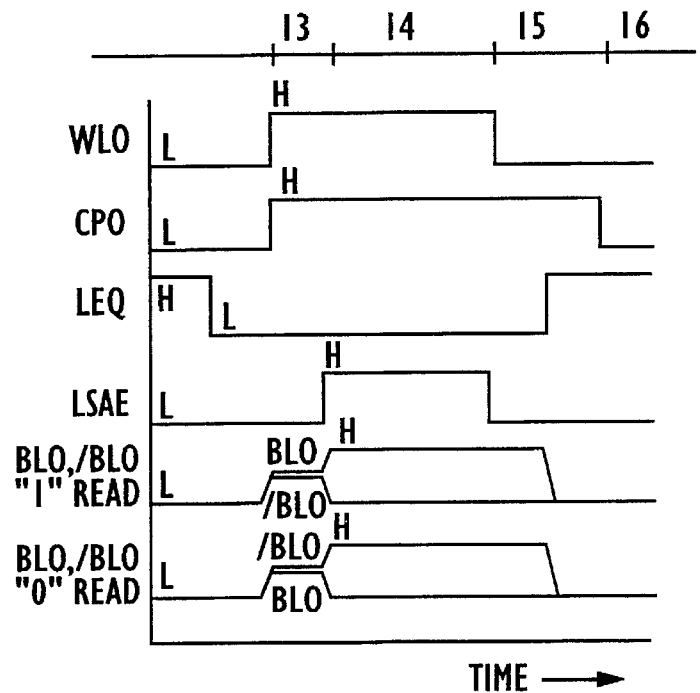
FIG. 21 shows a timing chart of a readout operation of the present invention in an eighth embodiment.

The normal data readout operation is identical to that performed in the fifth embodiment, and is represented in FIG. 2. However, the rewriting operation after the nth readout differs. FIG. 21 shows the nth readout and the subsequent data rewriting operation, and FIG. 22 represents a hysteresis curve corresponding to the readout and rewrite operation.

After the nth readout, the potential difference between point R and point T Vr8 is read out. In the subsequent data rewriting operation made after the nth readout operation, as shown by FIG. 21, the logical voltage of cell plate electrode CP0 is changed from "H" to "L" after the logical voltage of word line WL0 is changed from "H" to "L" turning off MOS transistors Qn00, Qn00B, making it impossible to rewrite.

This, if a data value "1" is stored, the state is sequentially shifted from point B to point B" over the path of 13–14–15–16 (B–R–B"). If the data value stored is a "0", the state is sequentially shifted from point E back to point E over the path of 13'–14'–15'–16'(E–T–D–T–E).

The operation of a ferroelectric capacitor storing a data value "1" is altered by this rewrite. Recalling that the straight lines in the hysteresis curve are defined not only by their slopes but also by the residual charges remaining in the ferroelectric capacitors after the power supply has been cut off, straight line LH6 is shifted downwards to LH7 when the state ferroelectric capacitor shifts from point B to point B". Consequently, when the (n+1)th readout operation is attempted, straight line LH6 has been shifted to straight line LH7, and the potential difference read out is Vr9 rather than Vr8.

The magnitude of potential difference Vr9 is so small that it cannot be amplified by the sense amplifier SA0. Thus, this eighth embodiment of the present invention limits the number of readouts by decreasing the potential difference to the extent that readout becomes impossible.

Embodiment 9

The circuit construction of the ninth embodiment is similar to that of the fifth embodiment shown in FIG. 10 except that the capacitances of adjusting capacitors Cb00 and Cb00B are smaller than those in the fifth embodiment. This decreased capacitance makes the slopes of the straight lines less steep, and is reflected in straight lines LHA1 and LLA1 shown in FIG. 24, whose slopes have a lesser absolute value than those of straight lines LH1 and LL1 shown in FIG. 12.

Figure 23:
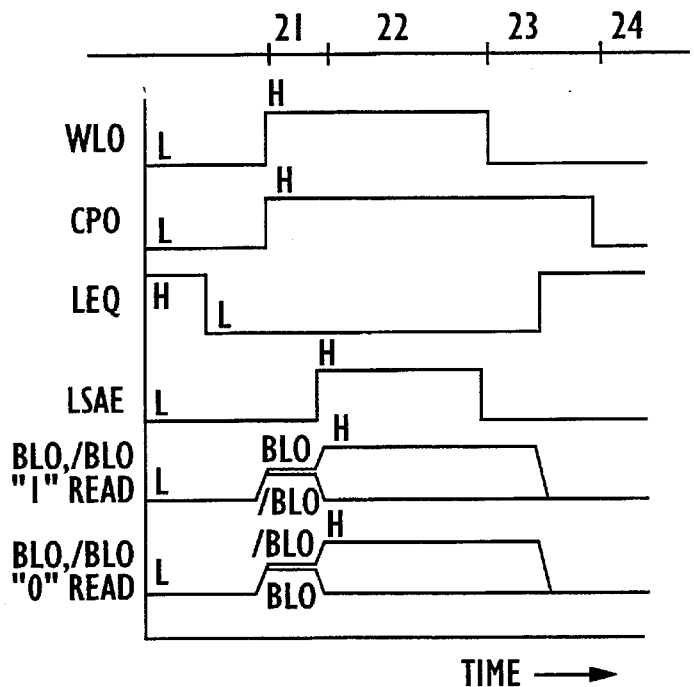
FIG. 23 shows a timing chart of a readout operation of the present invention in a ninth embodiment.
Figure 24:
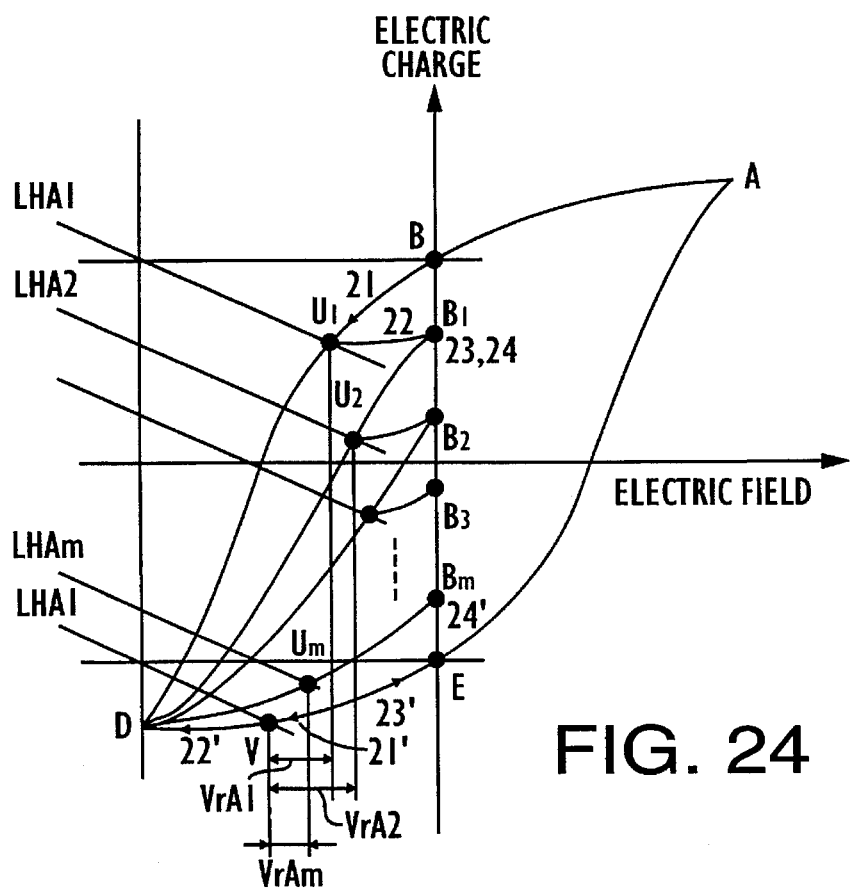
FIG. 24 shows a hysteresis curve of a ferroelectric capacitor of the present invention in a ninth embodiment.

Although the normal data readout operation is the same as that of the fifth embodiment (represented in FIG. 2), the rewriting operation performed after the nth readout operation differs. FIG. 23 shows readout operation made after the nth readout, and the data rewriting operation; FIG. 24 shows the corresponding hysteresis curve.

At the nth readout operation, the potential difference between point U1 and point V, VrA1, is read out. During the rewriting operation following the nth readout operation, the logical voltage of cell plate electrode CP0 is changed from "H" to "L" after the logical voltage of word line WL0 is changed from "H" to "L" as shown by FIG. 23 The state of a ferroelectric capacitor storing a data value "1" is therefore sequentially shifted from point B to point B1, over the path 21–22–23–24(B–U1–B1) as shown in FIG. 24. If the ferroelectric capacitor is storing a data value "0", the state is sequentially shifted from point E back to point E, over the path 21'–22'–23'–24' (E–V–D–V–E).

When attempting to perform the (n+1)th readout, the potential difference between point U2 and point V, VrA2, is read out, and point B1 is shifted to point B2.

By repeating the above readout and rewriting operations, point B1 is sequentially shifted to point B2, then point B3, eventually arriving at point Bm after the mth rewriting operation, giving readout potential difference VrAm.

When potential difference VrAm decreases to a voltage level too small to be amplified by sense amplifier SA0, subsequent readout operations will be impossible. The maximum number of possible readout operations in this embodiment is therefore not limited by n, the predetermined limiting number of readouts to be permitted, but rather by m, which can be adjusted by setting adjusting capacitors Cb00, Cb00B at a proper capacitance. Thus, this embodiment is effective when the limiting number of readouts cannot be initially determined.

Embodiment 10

Figure 25:
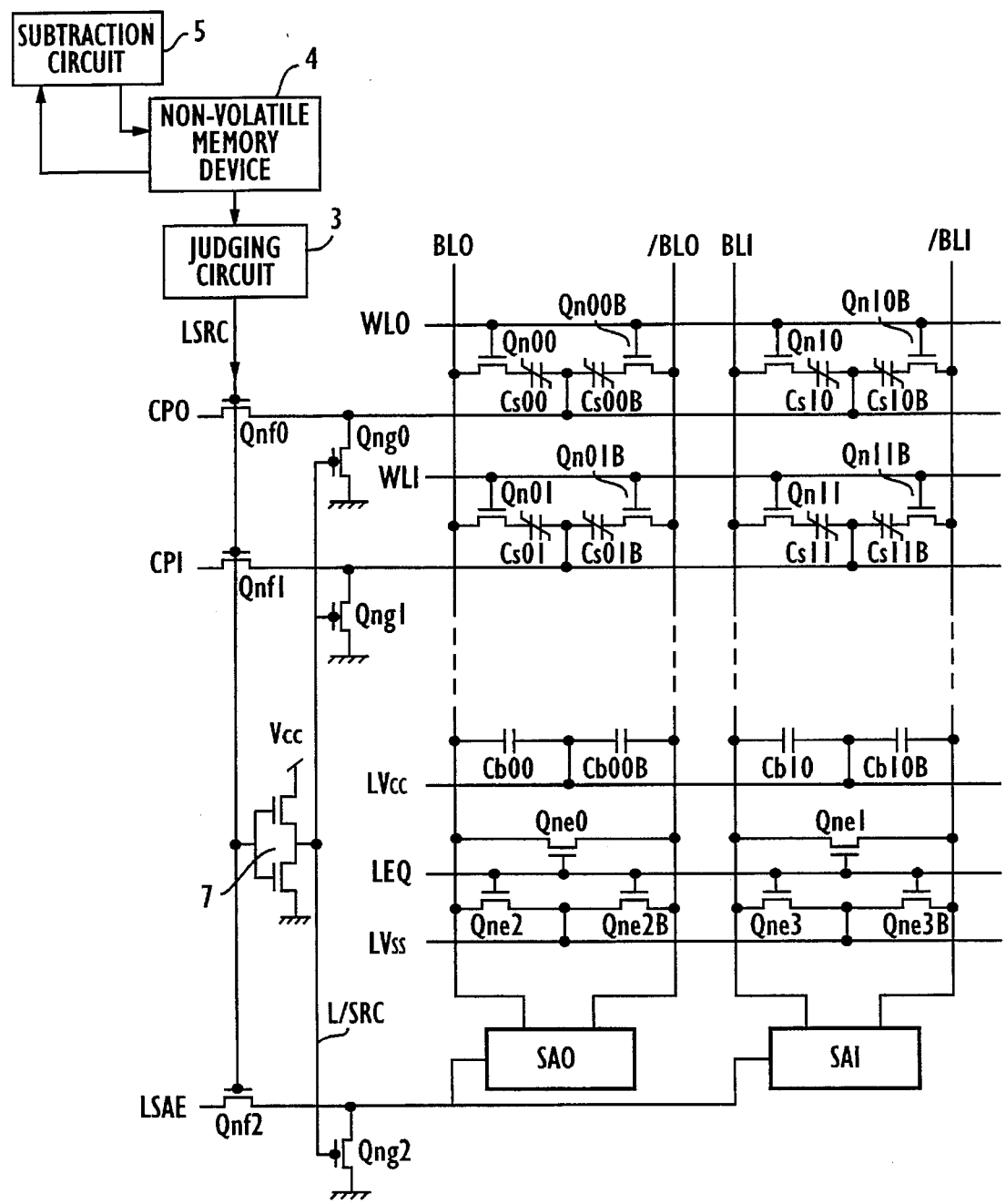
FIG. 25 shows a schematic circuit diagram of the present invention in a tenth embodiment.

The tenth embodiment of the present invention shown in FIG. 25 is a modification of the fifth embodiment shown in FIG. 10. The difference in this embodiment is the addition of a control circuit controlling the cell plate electrodes CP0, CP1 and sense amplifiers SA0, SA1.

The control circuit consists of determining MOS transistors Qnf0, Qnf1, Qnf2 for determining the connection of a control signal SRC to the memory cell region, a reversing circuit 7 for reversing control signal SRC, cell plate electrodes CP0, CP1, and grounding MOS transistors Qng0, Qng1, Qng2 for grounding cell plate electrodes CP0, CP1 and sense amplifiers SA0, SA1.

Signal line LSRC is connected to the gates of determining MOS transistors Qnf0, Qnf1, Qnf2, and the signal line L/SRC is connected to the gates of grounding MOS transistors Qng0, Qng1, Qng2. As long as the number of data readout operations already executed is less than the predetermined limiting number, n, of readouts, the timing of the operation is fundamentally the same as that in the fifth embodiment of the present invention. Namely, since the control signal SRC supplied to the gates of determining MOS transistors Qnf0, Qnf1, Qnf2 and the signal/SRC supplied to the gates of grounding MOS transistors Qng0, Qng1, Qng2 are inversely related, grounding MOS transistors Qng0, Qng1, Qng2 are off when determining MOS transistors Qnf0, Qnf1, Qnf2 are on.

FIG. 25 additionally shows that reversing circuit 7 is inserted between signal lines LSRC, L/SRC, and that judging circuit 3, nonvolatile memory device 4, and subtraction circuit 5 are serially connected to signal line LSRC.

Once the number of readouts executed reaches the predetermined limiting number n, which is memorized in nonvolatile memory device 4, judging circuit 3 outputs control signal SRC to turn off determining MOS transistors Qnf0, Qnf1, Qnf2 and to turn on grounding MOS transistors Qng0, Qng1, Qng2. This stops the control signal from reaching cell plate electrodes CP0, CP1 and grounds signal line LSAE, making the readout from and the writing into the memory cells impossible.

Thus, this embodiment of the present invention limits the number of readouts available to a data user by preventing movement of any charge stored in ferroelectric capacitors Cs00, Cs00B, Cs01, Cs01B, Cs10, Cs10B, Cs11, Cs11B after the nth readout, thereby locking the original data therein.

Embodiment 11

Figure 26:
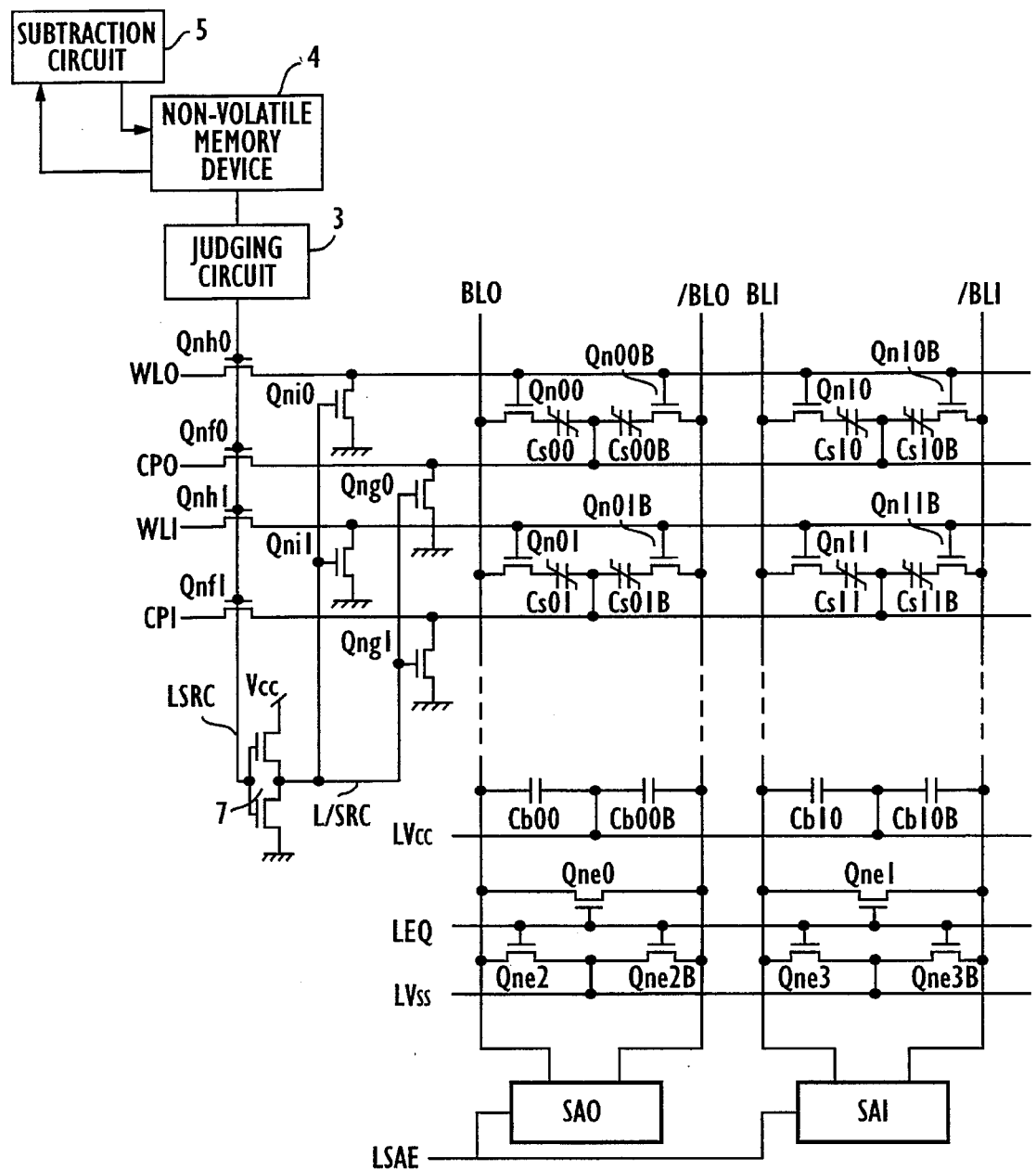
FIG. 26 shows a schematic circuit diagram of the present invention in an eleventh embodiment.
Figure 27:
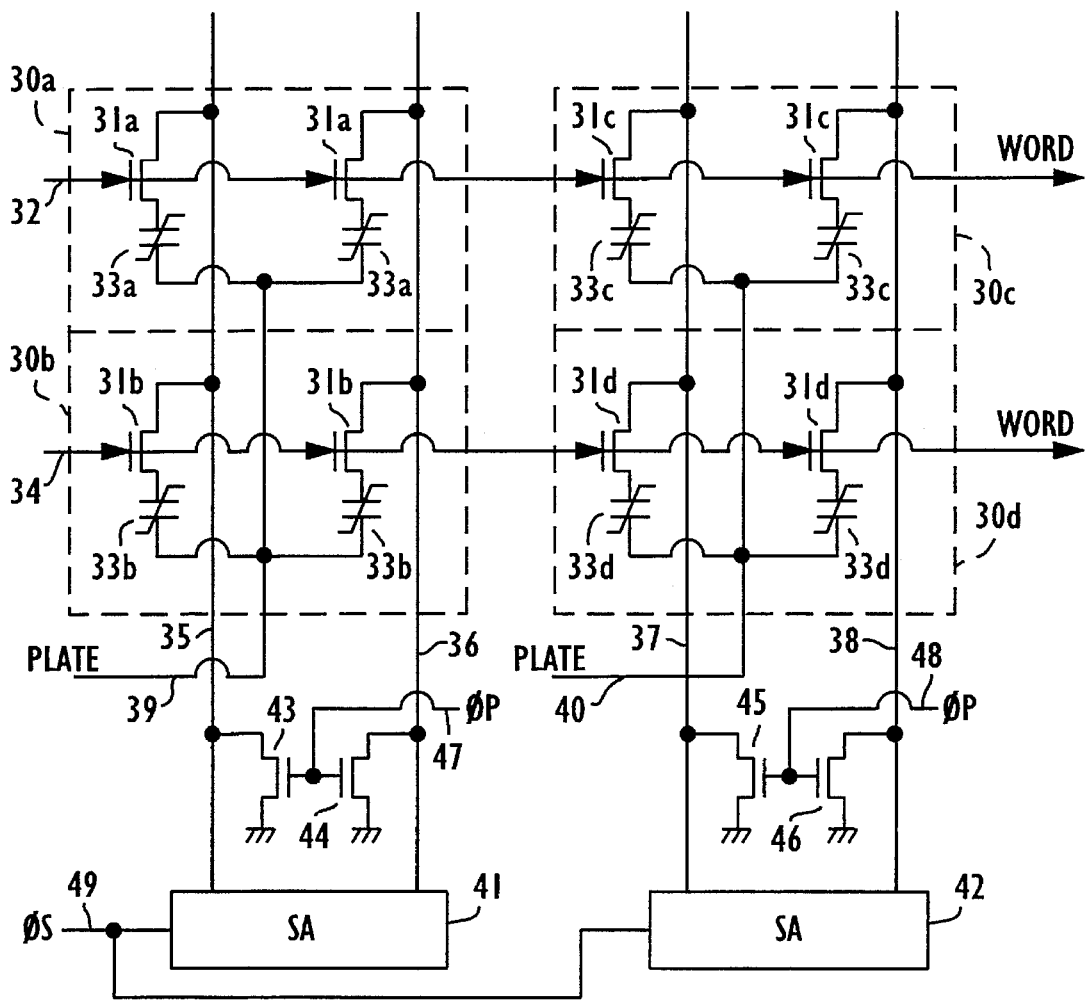
FIG. 27 shows a schematic circuit diagram of a conventional semiconductor memory device as taught by prior art.
Figure 28:
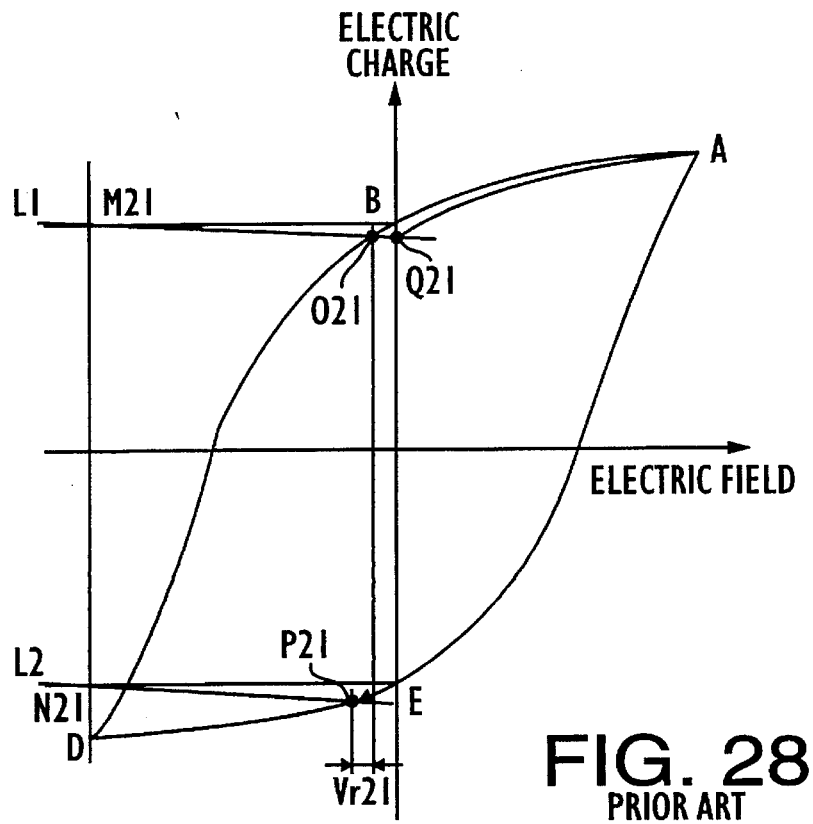
FIG. 28 shows a hysteresis curve of a ferroelectric capacitor used in a conventional semiconductor memory device as taught by prior art.
Figure 29:
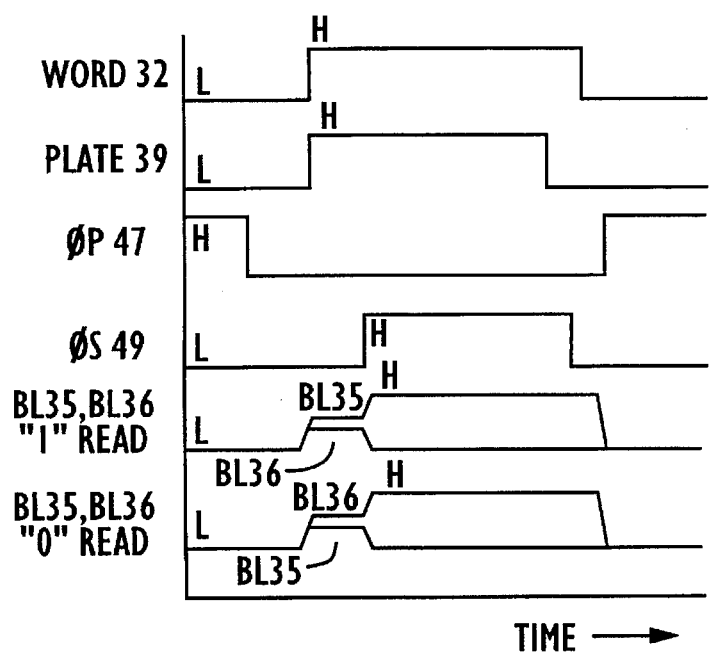
FIG. 29 shows a timing chart of a readout operation of a conventional semiconductor memory device as taught by prior art.

The eleventh embodiment of the present invention shown in FIG. 26 is a modification of the tenth embodiment shown in FIG. 25. The only difference is the substitution of a control circuit for controlling word lines WL0, WL1 and cell plate electrodes CP0, CP1, replacing the control circuit of the tenth embodiment controlling cell plate electrodes CP0, CP1 and sense amplifiers SA0, SA1.

Word lines WL0, WL1 are connected to signal line LSRC through determining MOS transistors Qnh0, Qnh1, and are further connected to signal line L/SRC through grounding MOS transistors Qni0 and Qni1. Thus, the normal data readout operation is essentially identical to that of the tenth embodiment of the present invention.

Specifically, since the signals supplied to the gates of determining MOS transistors Qnf0, Qnf1, Qnh0, Qnh1, and the signals supplied to the gates of grounding MOS transistors Qng0, Qng1, Qni0, Qni1 are inversely related, grounding MOS transistors Qng0, Qng1, Qni0, Qni1 are turned off when determining MOS transistors Qnf0, Qnf1, Qnh0, Qnh1 are turned on. Therefore, during normal readout operations, the signals on word lines WL0, WL1 and cell plate electrodes CP0, CP1 are supplied to the memory cell region and the semiconductor memory device continues to be normally operated.

When the number of readouts executed reaches the limiting number n of readouts permitted, which is memorized by nonvolatile memory device 4, judging circuit 3 outputs control signal SRC turning off determining MOS transistors Qnf0, Qnf1, Qnh0, Qnh1 and turning on grounding MOS transistors Qng0, Qng1, Qni0, Qni1.

Thus, word lines WL0, /WL0 and cell plate electrodes CP0, CP1 are grounded, making subsequent readout and writing operations impossible. No movement of charges stored in ferroelectric capacitors Cs00, Cs00B, Cs01, Cs01B, Cs10, Cs10B, Cs11, Cs11B can take place and the stored data is locked therein.

Of course, it should be understood that a wide range of changes and modifications can be made to the preferred embodiments described above. For example, although the above embodiments show memory cells consisting of two MOS transistors and two ferroelectric capacitors, a memory cell of the semiconductor memory device of the present invention may alternatively comprise one MOS transistor and one ferroelectric capacitor.

Furthermore, in the control circuit limiting the number of readouts permitted to a predetermined limit, a counter circuit for counting the number of readouts executed may be used instead of the subtraction circuit described above.

It is therefore intended that the foregoing detailed description be understood that it is the following claims, including all equivalents, which are intended to define the scope of this invention.

What is claimed is:

1. A semiconductor memory device comprising:

a pair of bit lines;

a word line;

a cell plate electrode;

a memory cell for storing normal data, connected to said bit lines, said word line, and said cell plate electrode; and a prevention means for preventing readout of said normal data stored in said memory cell by destroying said normal data, after a number of readouts already executed on said normal data reaches a predetermined limiting number of readouts.

2. A semiconductor memory device according to claim 1, wherein said memory cell comprises a MOS transistor and a ferroelectric capacitor.

3. A semiconductor memory device comprising:

a pair of bit lines;

a word line;

a cell plate electrode;

a memory cell for storing data, connected to said bit lines, said word line, and said cell plate electrode; and a prevention means for preventing normal readout of said data store in said memory cell, after a number of readouts already executed on said data reaches a predetermined limiting number of readouts, wherein said preventing means comprises an alteration means for altering bit line capacitance of at least one of said bit lines.

4. A semiconductor memory device according to claim 3, wherein said alteration means comprises a switch connected to a capacitor, wherein said switch is also connected to at least one of said bit lines for preventing readouts on said one or more connected bit lines.

5. A semiconductor memory device according to claim 4, wherein bit line capacitances of a first of said bit lines is different from bit line capacitance of a second of said bit lines when said switch is on.

6. A semiconductor memory device according to claim 4, further comprising at least one adjusting capacitor connected to at least one of said bit lines for adjusting bit line capacitance of said one or more connected bit lines, wherein said bit lines have approximately equal capacitance when said switch is on.

7. A semiconductor memory device according to claim 4, wherein bit line capacitance of said bit lines when said switch is on differs from bit line capacitance of said bit lines when said switch is off.

8. A semiconductor memory device according to claim 3, further comprising a control means connected to said alteration means for determining whether a number of readouts already executed on said stored data has reached said predetermined limiting number of readouts.

9. A semiconductor memory device according to claim 8, wherein said control means comprises a subtraction circuit for subtracting a number of readouts already executed on said stored data from said predetermined limiting number of readouts, a memory means for memorizing said subtracted number, and a judging circuit for determining whether said subtracted number has reached said predetermined limiting number of readouts.

10. A semiconductor memory device comprising:
- a pair of bit lines;
- a word line;
- a cell plate electrode;
- a memory cell for storing data, connected to said bit lines, said word line, and said cell plate electrode; and
- a prevention means for preventing normal readout of said data stored in said memory cell, after a number of readouts already executed on said data reaches a predetermined limiting number of readouts, wherein said prevention means comprises a signal reversing means for altering a normal reversing timing for a rewriting operation of at least one logical voltage supplied to said memory cell for a rewriting operation conducted after said predetermined limiting number of readouts have been executed.

11. A semiconductor memory device according to claim 10, wherein said signal reversing means comprises an equalizing means for equalizing logical voltages of said bit lines after said predetermined limiting number of readouts have been executed on said stored data.

12. A semiconductor memory device according to claim 11 wherein said equalizing means comprises a reversing means for reversing logical voltage of one of said bit lines by a control signal precharging said bit lines.

13. A semiconductor memory device according to claim 11, further comprising a pair of data lines, each respectively connected to one of said bit lines, wherein said equalizing means comprises said data lines, supplying equal logical voltages to both of said bit lines.

14. A semiconductor memory device according to claim 10, wherein said signal reversing means comprises a voltage reversing means for reversing logical voltages of said bit lines and subsequently reversing logical voltage of said cell plate electrode.

15. A semiconductor memory device according to claim 10, further comprising a control means connected to said signal reversing means, wherein said control means determines whether a number of readouts already executed on said stored data has reached said predetermined limiting number of readouts.

16. A semiconductor memory device according to claim 15, wherein said control means comprises a subtraction circuit for subtracting a number of readouts already executed on said stored data from said predetermined limiting number of readouts, a memory means for memorizing said subtracted number, and a judging circuit for determining whether said subtracted number has reached said predetermined limiting number of readouts.

17. A semiconductor memory device comprising:
- a pair of bit lines;
- a word line;
- a cell plate electrode;
- a memory cell for storing data, connected to said bit lines, said word line, and said cell plate electrode; and
- a prevention meads for preventing normal readout of said data stored in said memory cell, after a number of readouts already executed on said data reaches a predetermined limiting number of readouts, wherein said prevention means is a stopping means for stopping supply of a control signal to said memory cell after said predetermined limiting number of readouts have been executed on said stored data.

18. A semiconductor memory device according to claim 17, further comprising: a sense amplifier connected to said bit lines, wherein said stopping means comprises a switch connected to said cell plate electrode and to said sense amplifier; and a grounding means for grounding each of said cell plate electrode and said sense amplifier through said switch.

19. A semiconductor memory device according to claim 17, wherein said stopping means comprises a switch connected to said word line and to said cell plate electrode, and a grounding means for grounding said word line and said cell plate electrode through said switch.

20. A semiconductor memory device according to claim 17, further comprising a control means connected to said stopping means, wherein said control means determines whether a number of readouts already executed on said stored data has reached said predetermined limiting number of readouts.

21. A semiconductor memory device according to claim 20, wherein said control means comprises a subtraction circuit for subtracting a number of readouts already executed on said stored data from said predetermined limiting number of readouts, a memory means for memorizing said subtracted number, and a judging circuit for determining whether said subtracted number has reached said predetermined limiting number of readouts.

22. A method of limiting a number of readouts of normal data stored in a semiconductor memory device comprised of a pair of bit lines, a word line, a cell plate electrode, a memory cell connected to said bit lines, said word line, and said cell plate electrode, wherein said limiting method comprises the steps of:
- determining a number of readouts already executed on said normal data;
- determining whether said number of readouts already executed on said normal data has reached a predetermined limiting number of readouts;
- preventing subsequent readouts of said normal data by destroying said normal data upon determination that said number of readouts already executed on said normal data has reached said predetermined limiting number of readouts.

23. A method according to claim 22, wherein said memory cell is comprised of a MOS transistor and a ferroelectric capacitor.

24. A method according to claim 22, wherein said step of determining whether said number of readouts already executed on said normal data has reached said predetermined limiting number of readouts is achieved by a control means.

25. A method of limiting a number or readouts of data stored in a semiconductor memory device comprised of a pair of bit lines, a word line, a cell plate electrode, a memory cell connected to said bit lines, said word line, and said cell plate electrode, wherein said limiting method comprises the steps of:

determine a number of readouts already executed on said stored data;

determining whether said number of readouts already executed on said stored data has reached a predetermined limiting number of readouts;

preventing subsequent readouts of said stored data upon determination that said number of readouts already executed on said stored data has reached said predetermined limiting number of readouts, wherein said step of determining whether said number of readouts already executed on said stored data has reached said predetermined limiting number of readouts is achieved by a control means comprising:

a subtracted circuit for subtracting a number of readouts already executed on said stored data from said predetermined limiting number of readouts;

a memory means for memorizing said subtracted number; and a judging circuit for determine whether said subtracted number has reached said predetermined limiting number of readouts.

26. A method of limiting a number of readouts of data stored in a semiconductor memory device comprised of a pair of bit lines, a word line, a cell plate electrode, a memory cell connected to said bit lines, said word line, and said cell plate electrode, wherein said limiting method comprises the steps of:

determining a number of readouts already executed on said stored data;

determining whether said number of readouts already executed on said stored data has reached a predetermined limiting number of readouts;

preventing subsequent readouts of said stored data upon determination that said number of readouts already executed on said stored data has reached said predetermined limiting number of readouts, by altering bit line capacitance of at least one of said bit lines.

27. A method according to claim 26, wherein said semiconductor memory device further comprises at least one adjusting capacitor connected by a switch to at least of one of said bit lines, and said preventing step is achieved by adjusting said bit line capacitance of at least one of said bit lines by turning on said switch, connecting said adjusting capacitor to said connected bit line.

28. A method of limiting a number of readouts of data stored in a semiconductor memory device comprised of a pair of bit lines, a word line, a cell plate electrode, a memory cell connected to said bit lines, said word line, and said cell plate electrode, wherein said limiting method comprises the steps of:

determining a number of readouts already executed on said stored data;

determining whether said number of readouts already executed on said stored data has reached a predetermined limiting number of readouts;

preventing subsequent readouts of said stored data upon determination that said number of readouts already executed on said stored data has reached said predetermined limiting number of readouts, by equalizing logical voltage of said bit lines.

* * * * *